US009425215B2

(12) United States Patent
Yamazaki et al.

(10) Patent No.: US 9,425,215 B2
(45) Date of Patent: Aug. 23, 2016

(54) WIRELESS PROCESSOR, WIRELESS MEMORY, INFORMATION SYSTEM, AND SEMICONDUCTOR DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Kiyoshi Kato, Kanagawa (JP); Jun Koyama, Kanagawa (JP); Yutaka Shionoiri, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/801,936

(22) Filed: Jul. 17, 2015

(65) Prior Publication Data

US 2015/0325599 A1    Nov. 12, 2015

Related U.S. Application Data

(63) Continuation of application No. 14/266,930, filed on May 1, 2014, now Pat. No. 9,087,280, which is a continuation of application No. 11/571,859, filed as application No. PCT/JP2005/012967 on Jul. 7, 2005, now Pat. No. 8,716,814.

(30) Foreign Application Priority Data

Jul. 14, 2004  (JP) .................. 2004-207810
Jul. 14, 2004  (JP) .................. 2004-207824

(51) Int. Cl.
*H01L 27/14*     (2006.01)
*H01L 27/12*     (2006.01)
(Continued)

(52) U.S. Cl.
CPC ........ *H01L 27/1222* (2013.01); *G06K 19/0723* (2013.01); *H01L 23/5387* (2013.01);
(Continued)

(58) Field of Classification Search
USPC .......................................... 257/414; 235/454
See application file for complete search history.

(56) References Cited

U.S. PATENT DOCUMENTS 5,389,769 A    2/1995  Yamashita et al.
5,528,222 A    6/1996  Moskowitz et al.
(Continued)

FOREIGN PATENT DOCUMENTS

EP    0786667 A    7/1997
EP    0855675 A    7/1998
(Continued)

OTHER PUBLICATIONS

International Search Report (Application No. PCT/JP2005/012967) Dated Oct.11, 2005.
(Continued)

*Primary Examiner* — Timor Karimy
(74) *Attorney, Agent, or Firm* — Fish & Richardson P.C.

(57) ABSTRACT

The invention provides a processor obtained by forming a high functional integrated circuit using a polycrystalline semiconductor over a substrate which is sensitive to heat, such as a plastic substrate or a plastic film substrate. Moreover, the invention provides a wireless processor, a wireless memory, and an information processing system thereof which transmit and receive power or signals wirelessly. According to the invention, an information processing system includes an element forming region including a transistor which has at least a channel forming region formed of a semiconductor film separated into islands with a thickness of 10 to 200 nm, and an antenna. The transistor is fixed on a flexible substrate. The wireless processor in which a high functional integrated circuit including the element forming region is formed and the semiconductor device transmit and receive data through the antenna.

16 Claims, 27 Drawing Sheets

(51) Int. Cl.
*H01L 23/66* (2006.01)
*H01L 23/538* (2006.01)
*G06K 19/07* (2006.01)
*H01L 27/13* (2006.01)
*H01L 29/786* (2006.01)

(52) U.S. Cl.
CPC .............. *H01L23/66* (2013.01); *H01L 27/124* (2013.01); *H01L 27/1214* (2013.01); *H01L 27/1218* (2013.01); *H01L 27/1255* (2013.01); *H01L 27/13* (2013.01); *H01L 29/78621* (2013.01); *H01L 29/78648* (2013.01); *H01L 2223/6677* (2013.01)

(56) References Cited

U.S. PATENT DOCUMENTS

| | | |
|---|---|---|
| 5,760,643 A | 6/1998 | Whetsel |
| 5,764,882 A | 6/1998 | Shingo |
| 5,969,538 A | 10/1999 | Whetsel |
| 5,982,895 A | 11/1999 | Dworkin et al. |
| 5,994,912 A | 11/1999 | Whetsel |
| 6,046,600 A | 4/2000 | Whetsel |
| 6,166,557 A | 12/2000 | Whetsel |
| 6,262,587 B1 | 7/2001 | Whetsel |
| 6,326,801 B1 | 12/2001 | Whetsel |
| 6,421,157 B1 | 7/2002 | Matsui et al. |
| 6,509,217 B1 | 1/2003 | Reddy |
| 6,727,722 B2 | 4/2004 | Whetsel |
| 6,828,587 B2 | 12/2004 | Yamazaki et al. |
| 6,837,438 B1 | 1/2005 | Takasugi et al. |
| 6,954,080 B2 | 10/2005 | Whetsel |
| 6,987,382 B1 | 1/2006 | Whetsel |
| 7,062,292 B2 | 6/2006 | Lee |
| 7,180,093 B2 | 2/2007 | Takayama et al. |
| 7,180,319 B2 | 2/2007 | Whetsel |
| 7,230,447 B2 | 6/2007 | Whetsel |
| 7,271,076 B2 | 9/2007 | Yamazaki et al. |
| 7,362,093 B2 | 4/2008 | Whetsel |
| 7,362,120 B2 | 4/2008 | Whetsel |
| 7,452,786 B2 | 11/2008 | Dozen et al. |
| 7,465,647 B2 | 12/2008 | Yamazaki et al. |
| 7,487,373 B2 | 2/2009 | Koyama |
| 7,741,642 B2 | 6/2010 | Takayama et al. |
| 7,808,264 B2 | 10/2010 | Whetsel |
| 7,939,385 B2 | 5/2011 | Dozen et al. |
| 7,987,379 B2 | 7/2011 | Koyama |
| 8,236,629 B2 | 8/2012 | Dozen et al. |
| 8,321,711 B2 | 11/2012 | Koyama |
| 2002/0024356 A1 | 2/2002 | Whetsel |
| 2002/0139933 A1 | 10/2002 | Iida et al. |
| 2002/0179964 A1 | 12/2002 | Kato et al. |
| 2002/0185692 A1 | 12/2002 | Kurokawa et al. |
| 2004/0099926 A1 | 5/2004 | Yamazaki et al. |
| 2005/0157529 A1 | 7/2005 | Iwata et al. |
| 2005/0208921 A1 | 9/2005 | Roufoogaran |
| 2007/0241199 A1 | 10/2007 | Yamazaki et al. |
| 2008/0204065 A1 | 8/2008 | Whetsel |
| 2010/0195033 A1 | 8/2010 | Takayama et al. |
| 2010/0327908 A1 | 12/2010 | Whetsel |

FOREIGN PATENT DOCUMENTS

| | | |
|---|---|---|
| EP | 0949595 A | 10/1999 |
| EP | 1426813 A | 6/2004 |
| JP | 63-186360 A | 8/1988 |
| JP | 04-361394 A | 12/1992 |
| JP | 05-153187 A | 6/1993 |
| JP | 08-076900 A | 3/1996 |
| JP | 08-161279 A | 6/1996 |
| JP | 10-256576 A | 9/1998 |
| JP | 11-345266 A | 12/1999 |
| JP | 2000-137779 A | 5/2000 |
| JP | 2001-076108 A | 3/2001 |
| JP | 2002-064402 A | 2/2002 |
| JP | 2003-085501 A | 3/2003 |
| JP | 2004-080407 A | 3/2004 |
| JP | 2005-182551 A | 7/2005 |
| KR | 10-0191975 | 6/1999 |
| KR | 2004-0045354 A | 6/2004 |
| WO | WO-96/07985 | 3/1996 |
| WO | WO-03/103058 | 12/2003 |
| WO | WO-2004/040649 | 5/2004 |

OTHER PUBLICATIONS

Written Opinion (Application No. PCT/JP2005/012967) Dated Oct. 11, 2005.
Office Action (Application No. 200580023590.9) Dated May 9, 2008.
Korean Office Action (Application No. 2007-7002502) Dated Jul. 20, 2011.
Imaya.A, "CG Silicon Technology and Its Application", AM-LCD '03 Digest of Technical Papers, 2003, pp. 1-4.
Lee.B et al., "9.4 A CPU on a Glass Substrate Using CG-Silicon TFTs", ISSCC 2003 (Digest of Technical Papers. IEEE International Solid-State Circuits Conference), Feb. 11, 2003, pp. 164-165.
Korean Office Action (Application No. 2012-7008103) Dated Apr. 30, 2012.
Korean Office Action (Application No. 2013-7002175) Dated Feb. 27, 2013.

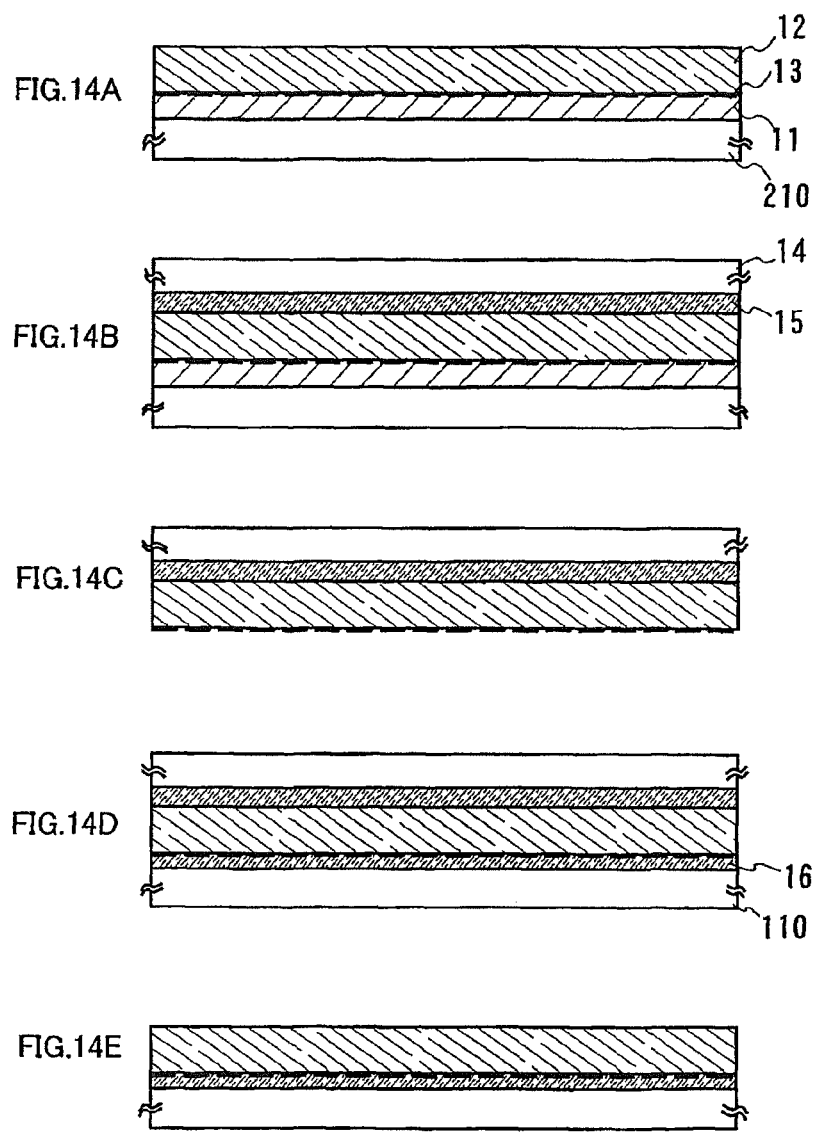

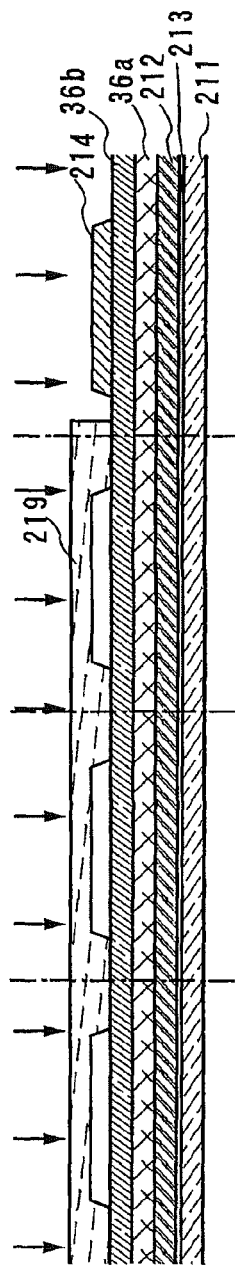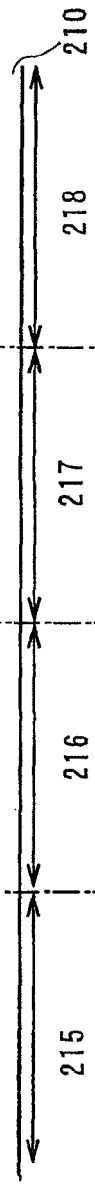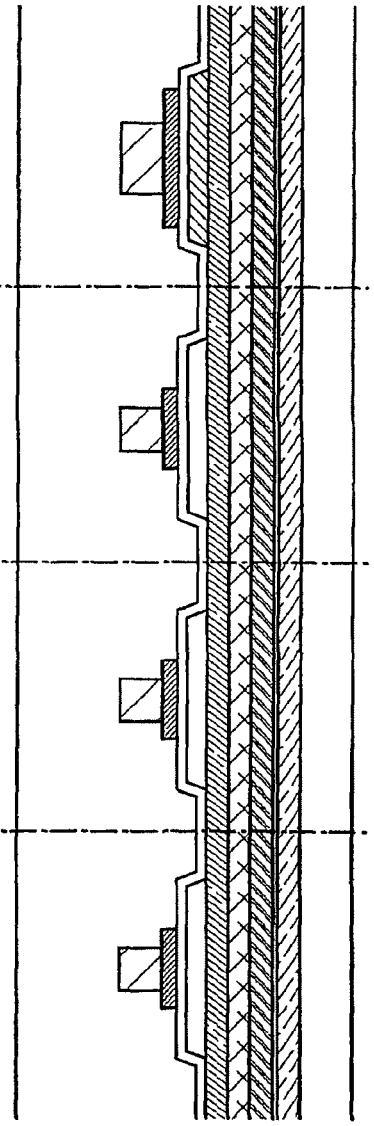

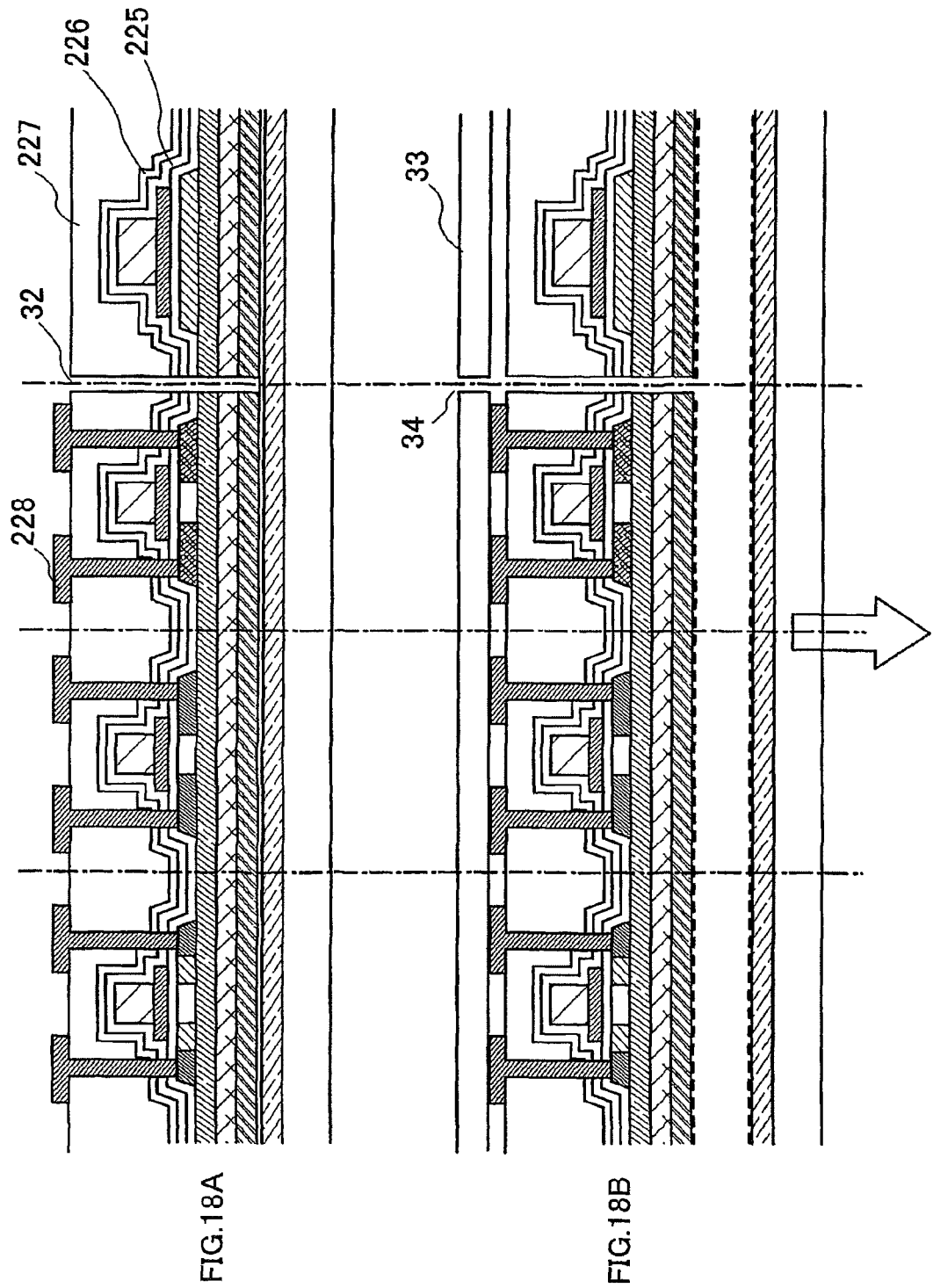

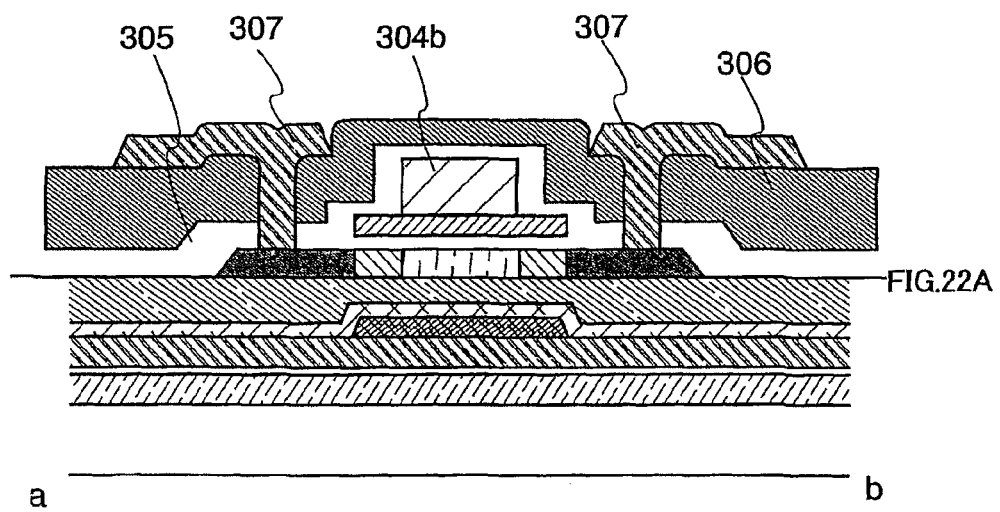
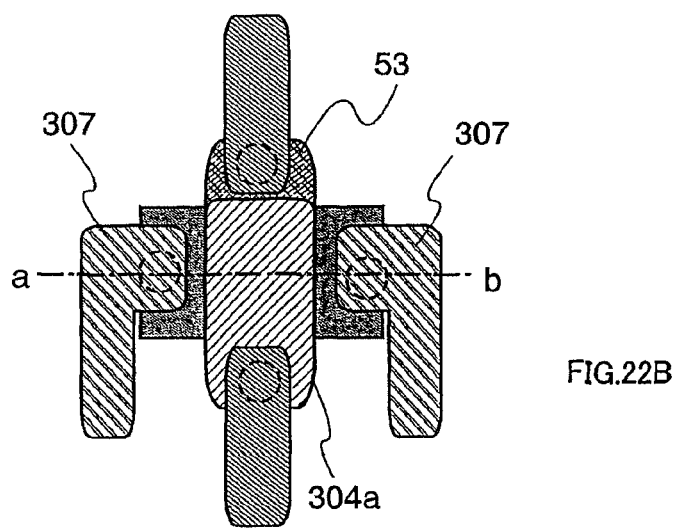

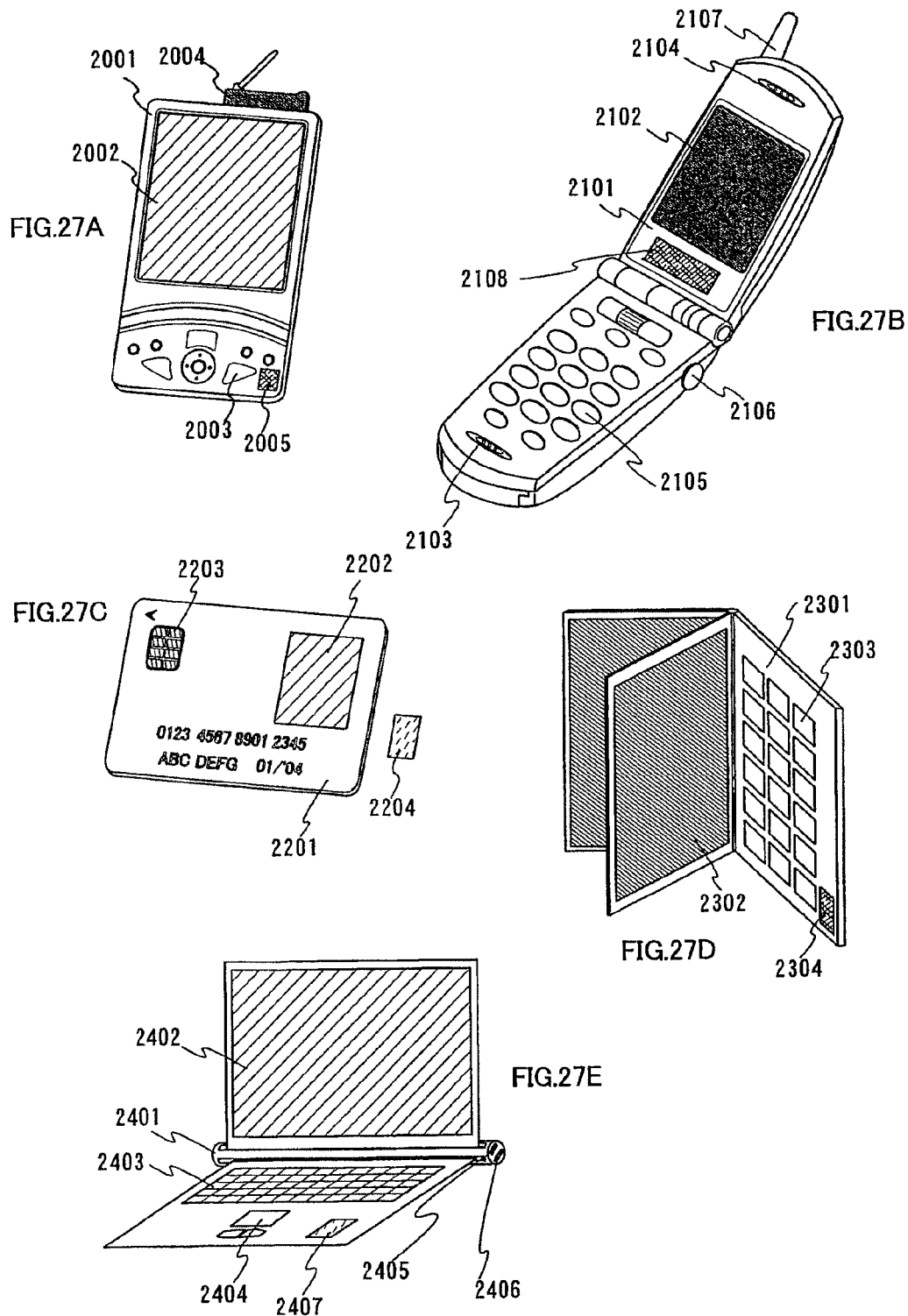

WIRELESS PROCESSOR, WIRELESS MEMORY, INFORMATION SYSTEM, AND SEMICONDUCTOR DEVICE

CROSS-REFERENCE TO RELATED APPLICATIONS

This application is a continuation of U.S. application Ser. No. 14/266,930, filed May 1, 2014, now allowed, which is a continuation of U.S. application Ser. No. 11/571,859, filed Jan. 9, 2007, now U.S. Pat. No. 8,716,814, which is a U.S. National Phase of International Patent Application No. PCT/JP2005/012967, filed Jul. 7, 2005, which claims the benefit of foreign priority applications filed in Japan as Serial No. 2004-207824 and Serial No. 2004-207810, both filed on Jul. 14, 2004, all of which are incorporated by reference.

DESCRIPTION

1. Technical Field

The present invention relates to a wireless processor or a wireless memory formed by using a plastic material for a substrate and including an integrated circuit formed of a thin film transistor thereover. Moreover, the invention relates to a semiconductor device provided with the wireless processor or the wireless memory.

2. Background Art

A liquid crystal display panel has been developed which has a pixel portion and a driver circuit integrated over the same glass substrate by using thin film transistors (TFTs) formed of a crystalline semiconductor film with a thickness of several ten nanometers. Further, a technique to manufacture a central processing unit (CPU) which is a central function of a computer by using high functional polycrystalline silicon which is superior in crystallinity has been reported as well (for example, refer to Non-patent Documents 1 and 2). In the case where a pixel portion and a driver circuit are integrated over the same glass substrate, a memory is also formed over the same substrate. With such a technical progress, a technique called System on Panel to integrate a display function and a computer function realized by a CPU over a glass substrate is becoming to be realized.

A memory is generally formed by using a silicon wafer. However, the aforementioned system panel which is required to be thin and lightweight is expected to have a memory formed by using a plastic substrate or a plastic film substrate. This is because plastic is low in specific gravity, lightweight, and high in shock resistance as compared to a silicon wafer and glass.

However, a plastic material is generally poor in heat resistance, thus the highest temperature of the process is required to be decreased. Accordingly, a crystalline semiconductor film to form a memory cannot be formed.

Non-Patent Document 1

Imaya, A., "CG Silicon technology and its application", AM-LCD 2003 Digest, p. 1, 2003.

Non-Patent Document 2

Lee, B. Y., et al., "A CPU on a glass substrate using CG-Silicon TFTs", ISSCC Digest, p. 164, 2003.

DISCLOSURE OF INVENTION

In view of the aforementioned, the invention provides a processor or a memory having a high functional integrated circuit formed by using a polycrystalline semiconductor over a substrate which is sensitive to heat such as a plastic substrate or a plastic film substrate. Moreover, the invention provides a wireless processor or a wireless memory which transmits and receives power or signals wirelessly, and a semiconductor device incorporating the wireless processor or the wireless memory.

In view of the aforementioned, the invention provides a processor or a memory having a high functional integrated circuit fixed over a plastic substrate or the like which is sensitive to heat. The processor or the memory can transmit and receive signals or power by an antenna, a light detecting element, or a light emitting element.

According to one specific mode of the wireless processor of the invention, an element forming region including a transistor which has at least a channel forming region formed of at least one semiconductor film among semiconductor films separated into islands with a thickness of 10 to 200 nm, and an antenna are provided. The transistor is fixed on a flexible substrate. Further, a high functional integrated circuit which has the element forming region is provided.

According to another mode of the wireless processor of the invention, an element forming region including a transistor which has at least a channel forming region formed of at least one semiconductor film among semiconductor films separated into islands with a thickness of 10 to 200 nm, and one of a light detecting element and a light emitting element are provided. The transistor is fixed on a flexible substrate. Further, a high functional integrated circuit which has the element forming region is provided.

It is to be noted that the wireless processor of the invention includes a connecting unit.

The invention provides an information processing system between a wireless processor and a semiconductor device provided with the wireless processor. Here, providing also means incorporating and arranging in the vicinity.

According to one specific mode of the information processing system of the invention, an element forming region including a transistor which has at least a channel forming region formed of at least one semiconductor film among semiconductor films separated into islands with a thickness of 10 to 200 nm, and an antenna are provided. The transistor is fixed on a flexible substrate. The wireless processor in which a high functional integrated circuit including the element forming region is formed and the semiconductor device transmit and receive data through the antenna.

According to another mode of the information processing system of the invention, an element forming region including a transistor which has at least a channel forming region formed of at least one semiconductor film among semiconductor films separated into islands with a thickness of 10 to 200 nm, and one of a light detecting element and a light emitting element are provided. The transistor is fixed on a flexible substrate. The wireless processor in which a high functional integrated circuit including the element forming region is formed and the semiconductor device transmit and receive data by using one of a light detecting element and a light emitting element.

As a transistor which has at least a channel forming region formed of at least one semiconductor film among semiconductor films separated into islands with a thickness of 10 to 200 nm, a thin film transistor can be used, for example.

According to the invention, a semiconductor device which realizes the aforementioned information processing system can be provided.

According to one specific mode of the semiconductor device of the invention, an arithmetic unit, a memory unit, and an interface for the wireless processor which includes a PCI interface, a control circuit, and an electric wave interface are provided.

According to another mode of the semiconductor device of the invention, an arithmetic unit, a memory unit, a hard disc, and an interface for the wireless processor which includes a PCI interface, a control circuit, and an electric wave interface are provided.

According to one specific mode of the invention, a wireless memory includes an RF circuit and a memory which includes a transistor including at least a channel forming region formed of at least one semiconductor film among semiconductor films separated into islands with a thickness of 10 to 200 nm. The transistor is fixed on a plastic substrate. Further, a high functional integrated circuit which includes the element forming region is provided.

According to the invention, an RF circuit includes an antenna.

According to another mode of the invention, a wireless memory includes a memory which includes a transistor including at least a channel forming region formed of at least one semiconductor film among semiconductor films separated into islands with a thickness of 10 to 200 nm, and one of a light detecting element and a light emitting element. The transistor is fixed on a plastic substrate. Further, a high functional integrated circuit which includes the element forming region is provided.

According to another mode of the invention, a semiconductor device incorporates a wireless memory.

Specifically, a semiconductor device of the invention includes an arithmetic unit, a memory unit, and an interface for a wireless memory which includes a PCI interface, a control circuit, and an electric wave interface.

According to another mode of the semiconductor device of the invention, an arithmetic unit, a memory unit, a hard disc, and an interface for a wireless memory which includes a PCI interface, a control circuit, and an electric wave interface are provided.

According to another mode of the invention, an information processing system is provided in which a wireless memory and a semiconductor device transmit and receive data and power by using an antenna or one of a light detecting element and a light emitting element.

Specifically, an information processing system of the invention includes an antenna and an element forming region which includes a transistor including at least a channel forming region formed of at least one semiconductor film among semiconductor films separated into islands with a thickness of 10 to 200 nm. The transistor is fixed on a flexible substrate. A semiconductor device and a wireless memory in which a functional integrated circuit including the element forming region is formed transmit and receive data through the antenna.

According to another mode of the information processing system of the invention, the information processing system includes an element forming region which includes a transistor including at least a channel forming region formed of at least one semiconductor film among semiconductor films separated into islands with a thickness of 10 to 200 nm, and one of a light detecting element and a light emitting element. The transistor is fixed on a flexible substrate. A semiconductor device and a wireless memory in which a high functional integrated circuit including the element forming region is formed transmit and receive data by using one of the light detecting element and the light emitting element.

According to the invention, a processor can be connected wirelessly. That is, data and power can be transmitted and received wirelessly between the processor and a semiconductor device. Therefore, a processor can be easily increased. In this manner, wireless transmission and reception of power or signals can add high value to a processor.

According to the invention, a memory can be connected wirelessly. That is, data and power can be transmitted and received wirelessly between a memory and a semiconductor device. Therefore, a memory can be easily increased. In this manner, wireless transmission and reception of power or signals can add high value to a memory and a semiconductor device.

According to the invention, a wireless processor or a wireless memory which is superior in shock resistance and flexibility can be obtained by forming a high functional integrated circuit such as an arithmetic unit on a plastic substrate.

BRIEF DESCRIPTION OF DRAWINGS

FIGS. 14A to 14E are diagrams showing a wireless processor or a wireless memory of the invention.

FIGS. 16A to 16C are diagrams showing manufacturing steps of a wireless processor or a wireless memory of the invention.

FIGS. 18A and 18B are diagrams showing manufacturing steps of a wireless processor or a wireless memory of the invention.

FIGS. 22A and 22B are diagrams showing manufacturing steps of a wireless processor or a wireless memory of the invention.

FIGS. 27A to 27E are views of semiconductor devices to each of which a wireless processor of the invention is mounted.

BEST MODE FOR CARRYING OUT THE INVENTION

Figure 1:
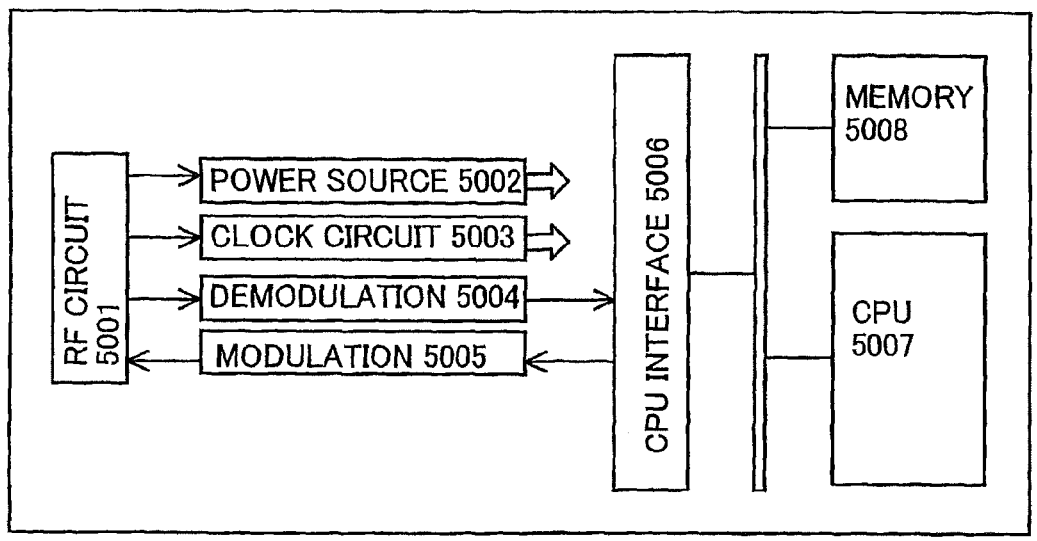
FIG. 1 is a diagram showing a wireless processor of the invention.

Although the invention will be fully described by way of embodiment modes and embodiments with reference to the accompanying drawings, it is to be understood that various changes and modifications will be apparent to those skilled in the art. Therefore, unless otherwise such changes and modifications depart from the scope of the invention, they should be construed as being included therein. It is to be noted that identical portions in embodiment modes and embodiments are denoted by the same reference numerals and detailed descriptions thereof are omitted.

Embodiment Mode 1

In this embodiment mode, a configuration of a wireless processor of the invention is described.

FIG. 1 shows a typical circuit configuration of a wireless processor. In FIG. 1, a wireless processor 5000 includes an RF circuit 5001, a power source circuit 5002, a clock generating circuit 5003, a data demodulation circuit 5004, a load modulation circuit 5005, a CPU interface 5006, an arithmetic processing unit (hereinafter referred to as a CPU as a function as a so-called CPU is included) 5007, and a memory 5008.

The wireless processor 5000 can receive a power supply through electromagnetic waves and can also transmit and receive data through an antenna included in the RF circuit. The power may be supplied from an incorporated battery instead of being supplied through the antenna, or both of these may be used in combination. Furthermore, one of a light detecting element and a light emitting element may be incorporated as a data transmission/reception unit so that infrared data communication thereby can be performed.

When electromagnetic waves are supplied to the RF circuit 5001, power is generated in the power source circuit 5002, a clock signal is generated in the clock generating circuit 5003, and data is demodulated in the data demodulation circuit 5004 respectively. Moreover, a load modulation in accordance with transmitted data is performed in the load modulation circuit 5005. The CPU interface 5008 controls data communication between an external system and a CPU.

As a work region of the CPU 5007, the memory 5008 may be provided with a volatile SRAM or DRAM, or a nonvolatile memory which can hold data even when the power is not supplied. As a typical nonvolatile memory, a flash memory and an EEPROM can be used. As a memory element, a floating gate transistor, a quantum dot transistor, a ferroelectric memory element and the like can be used. It is to be noted that a memory is not necessarily provided in the wireless processor when an external memory is employed.

It is to be noted that a wireless processor can be formed on a plastic substrate or a plastic film substrate (these may be collectively referred to as a flexible substrate). Specifically, the RF circuit 5001, the power source circuit 5002, the clock generating circuit 5003, the data demodulation circuit 5004, the load modulation circuit 5005, the CPU interface 5006, the CPU 5007, and the memory 5008 (these correspond to a high functional integrated circuit) can be formed so as to have an element forming region which includes a transistor including at least a channel forming region formed of at least one semiconductor film among semiconductor films separated into islands with a thickness of 10 to 200 nm formed over a flexible substrate 110. As a specific transistor, a thin film transistor (TFT) can be used. The antenna included in the RF circuit may be fixed on a flexible substrate such as a plastic substrate or may be formed separately from the substrate and connected thereto. A detailed manufacturing method will be described in Embodiment Mode 12 or 13. As a result, a wireless processor which is superior in shock resistance and flexibility can be obtained.

Figure 2:
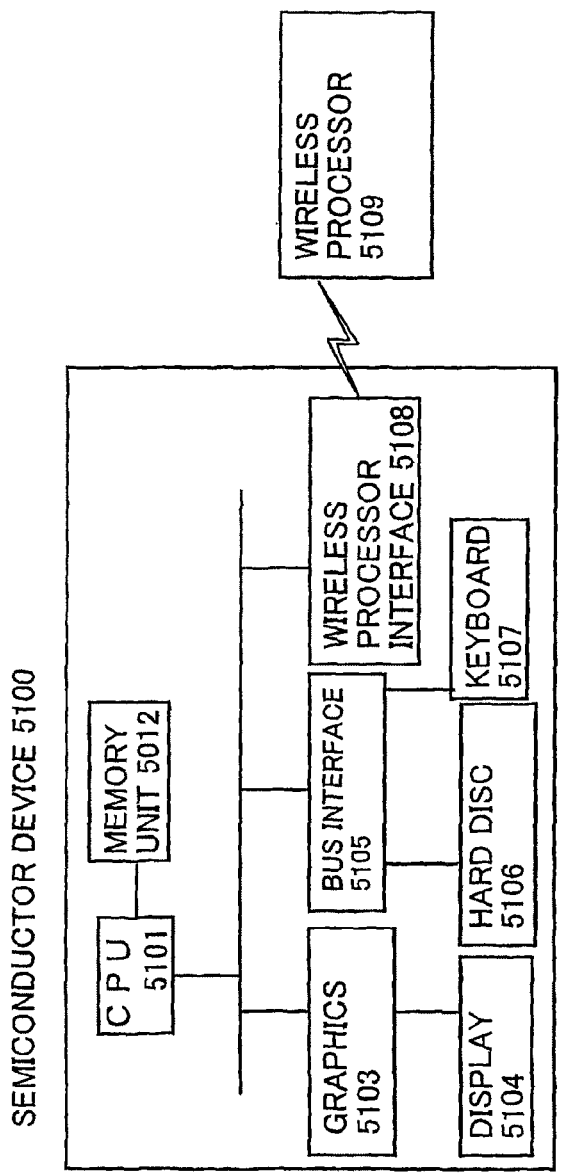
FIG. 2 is a diagram showing a wireless processor and a semiconductor device of the invention.

Next, FIG. 2 shows a configuration example of a system in which the wireless processor of the invention is included. FIG. 2 shows a system including a semiconductor device 5100 and a wireless processor 5109. The semiconductor device 5100 is provided with a wireless processor interface 5108 in addition to a typical configuration such as a personal computer. In FIG. 2, the semiconductor device 5100 includes a central processing unit (CPU) 5101, a memory unit 5102, a graphics 5103 connected to a PCI bus, a display 5104 connected to the graphics 5103, a bus interface (for example, a south bridge and the like) 5105, a hard disc 5106 connected to the interface 5105, a keyboard 5107, a wireless processor interface 5108 and the like. As the memory unit 5102, for example, a DRAM, an SRAM, a DRAM, or a nonvolatile memory can be used. The wireless processor interface 5108 transmits and receives data with the wireless processor 5109 through the antenna. When the wireless processor 5109 includes one of a light detecting element and a light emitting element while the semiconductor device includes the other, data transmission/reception through infrared communication can be realized.

FIG. 2 shows a mode where the wireless processor interface 5108 is connected to a PCI bus; however, the wireless processor interface 5108 may be connected to a south bridge or other buses.

The description has been made on the case where the semiconductor device 5100 is typically a personal computer; however, various semiconductor devices incorporating a CPU and an ASIC, such as a PDA, a game machine, and a DVD are applicable as well.

It is one of the features of the invention that a processor can be connected wirelessly. That is, data and power can be transmitted and received wirelessly between the processor and a semiconductor device. Therefore, the processor can be easily increased. For example, provided that a communicable distance of the wire processor interface is 1 mm to 50 cm, the wireless processor interface can recognize the wireless processor no matter where it is attached to the body of the personal computer. It is preferable that the wireless processor interface be designed to realize the aforementioned feature. It is convenient that the wireless processor be attached on a body with an attaching agent such as a magnet and a seal. That is, it is a feature of the wireless processor of the invention to have an attaching agent for fixing to an object is provided.

Figure 3:
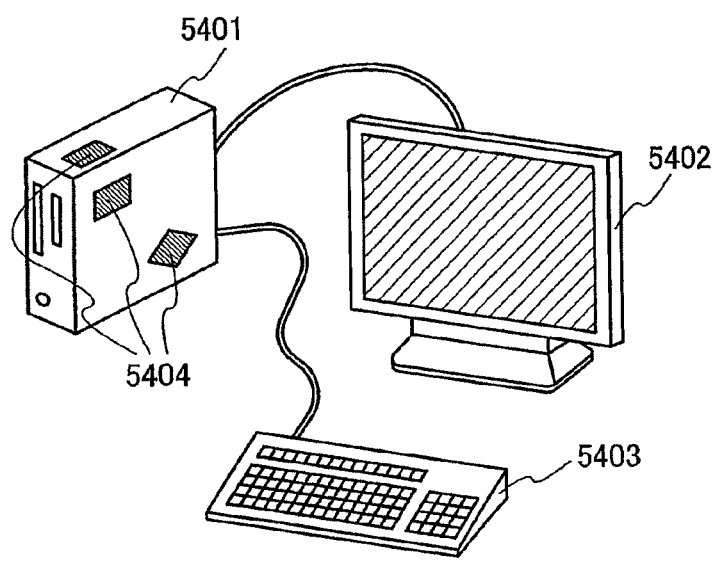
FIG. 3 is a view showing wireless processors of the invention mounted to a personal computer.

As a result, by only attaching wireless processors 5404 to a main body 5401 of a personal computer which is one mode of a semiconductor device as shown in FIG. 3, a function of the processor can be incorporated in the system. Wireless transmission and reception of power and signals can add high value to the processor and the semiconductor device. The personal computer includes a display 5402 and a keyboard 5403.

By increasing the processor in this manner, parallel computation by using a plurality of processors can be realized, which can reduce a load imposed on the CPU. It is to be noted that the wireless processor is preferably used for an application where data communication with system is rather less frequent since data is transferred serially through the antenna.

In this manner, wireless transmission and reception of power or signals can eliminate a connection defect of a connector and the like. Moreover, a defect which occurs in handling the device caused by a wiring which connects each device and the like can be eliminated. In the case where the power is received only through the antenna, a battery and the like are not required to be incorporated, which leads to a further reduction in weight.

Embodiment Mode 2

In this embodiment mode, an example of a circuit configuration of a wireless processor interface 5200 is described with reference to FIG. 4.

Figure 4:
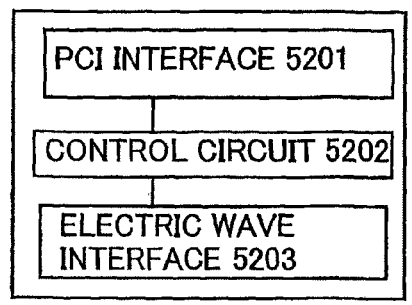
FIG. 4 is a diagram showing a wireless processor interface of the invention.

The wireless processor interface 5200 shown in FIG. 4 is connected to a PCI bus and includes a PCI interface 5201, a control circuit 5202, and an electric wave interface 5203. The electric wave interface 5203 depends on a communication method such as an electromagnetic induction method and a microwave method.

The electric wave interface 5203 includes, for example, a data transmission path 5708, a data reception path 5709, an oscillation circuit 5701, and an antenna 5704. When transmission data is inputted to the data transmission path 5708 in such an electric wave interface 5203, a signal from the oscillation circuit 5701 is modulated in a modulation circuit 5702, amplified in an amplifier circuit 5703, and transmitted to the antenna 5704. On the other hand, when a reception signal from the antenna 5704 is inputted to the data reception path 5709, only a response signal from a wireless processor is received by a band path filter 5707. The received signal is amplified in an amplifier circuit 5706, demodulated in a demodulation circuit 5705, and transmitted to the control circuit 5202. Examples of a control signal are an enable signal, a frequency control signal, a stand-by signal and the like.

The control circuit 5202 shown in FIG. 4 is in charge of communication with application software which controls a wireless processor from a main body of system, execution of instructions, communication with a wireless processor, and coding and decoding of signals. Further, the control circuit 5202 processes encryption and decryption, recognition, and collision as required. In order to make sure that communication is made with the same wireless processor, it is preferable that an ID number given to a wireless processor be regularly read and recognized.

The PCI interface 5201 is an interface used for communicating data between the control circuit 5202 and a main body of system through a PCI bus. In this embodiment mode, the PCI interface 5201 is connected to a PCI bus, however, a wireless memory can be incorporated in the main body of system with other bus by changing the PCI bus interface portion to a bus interface suitable for a bus to be connected.

Embodiment Mode 3

According to the wireless processor of the invention, a plurality of wireless processors can be connected by one wireless processor interface. In this embodiment mode, an example of such a mode is described with reference to FIG. 6.

Figure 6:
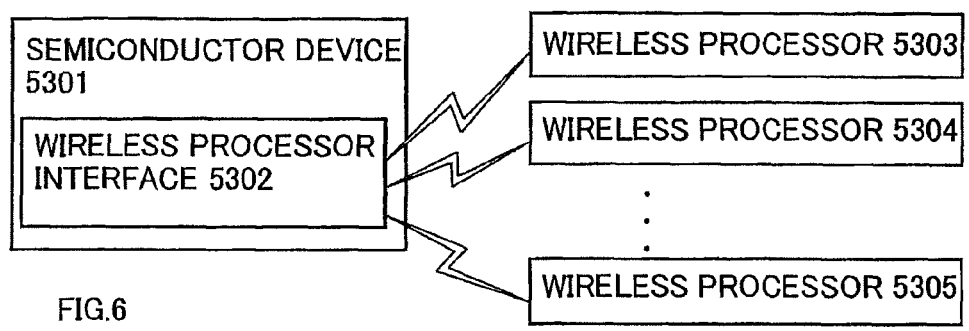
FIG. 6 is a diagram showing a wireless processor and a semiconductor device of the invention.

FIG. 6 shows a system including a plurality of wireless processors 5303 to 5305 and a semiconductor device 5301 which includes a wireless processor interface 5302.

Description is made on a configuration in which the wireless processor interface 5302 recognizes and controls the plurality of wireless processors. First, the case where each of the wireless processors has a unique ID number is described, and then the case where the wireless processors are each identical and do not have unique ID numbers is described. In either case, each of the wireless processors has an ID number which is recognizable in the system when the wireless processor is incorporated in the system. Reading the ID number, the system can selectively communicate with the wireless processor having the ID number. Such a selective communication can be realized in the case where the wireless processor accepts such a command that the wireless processor communicates data only when the ID number is matched.

In order to recognize a plurality of wireless processors, ID numbers which are recognizable in the system are required to be obtained as described above. For example, ID numbers of all wireless processors within a communicable region can be obtained by a method as shown in a flow chart of FIG. 7A. First, a system regularly reads an ID number of a wireless processor within a communicable region. That is, the system has a unit for interrogating all the wireless processors within the communicable region. In the case where there are no wireless processors in the communicable region, no response is made, thus the system processes no data. In such a case, an ID may be interrogated again. In the case where one or more wireless processors are in the communicable region, the system may be able to read an ID number normally (reading success) or may fail to read an ID number due to a collision (collision). In the case where the ID number can be read normally, the ID number can be successfully obtained. When the read ID number is not registered in the system, it is newly registered therein. On the other hand, in the case where data fails to be read due to a collision, an ID may be read again.

According to the aforementioned method, in the case where a timing at which an ID number is transmitted from each wireless processor is common among a plurality of wireless processors, it is hard to avoid a collision of a plurality of wireless processors, thus it becomes difficult to obtain an ID number. In order that this method functions efficiently, a timing at which an ID number is transmitted is made different for each wireless processor. Alternatively, a timing at which an ID number is transmitted is changed every time reading is performed. In specific, a transmission timing is determined based on the ID number or based on a random number generated every time an ID number is read. According to this method, the wireless processor interface may employ a method to use data with no collision among a plurality of received data at reception timings divided into a plurality of divisions.

Figure 7A:
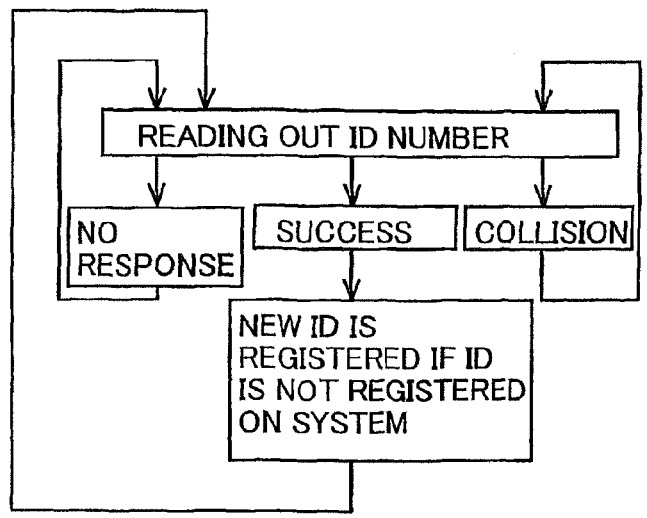
FIGS. 7A and 7B are diagrams showing use modes of a wireless processor or a wireless memory of the invention.
Figure 7B:
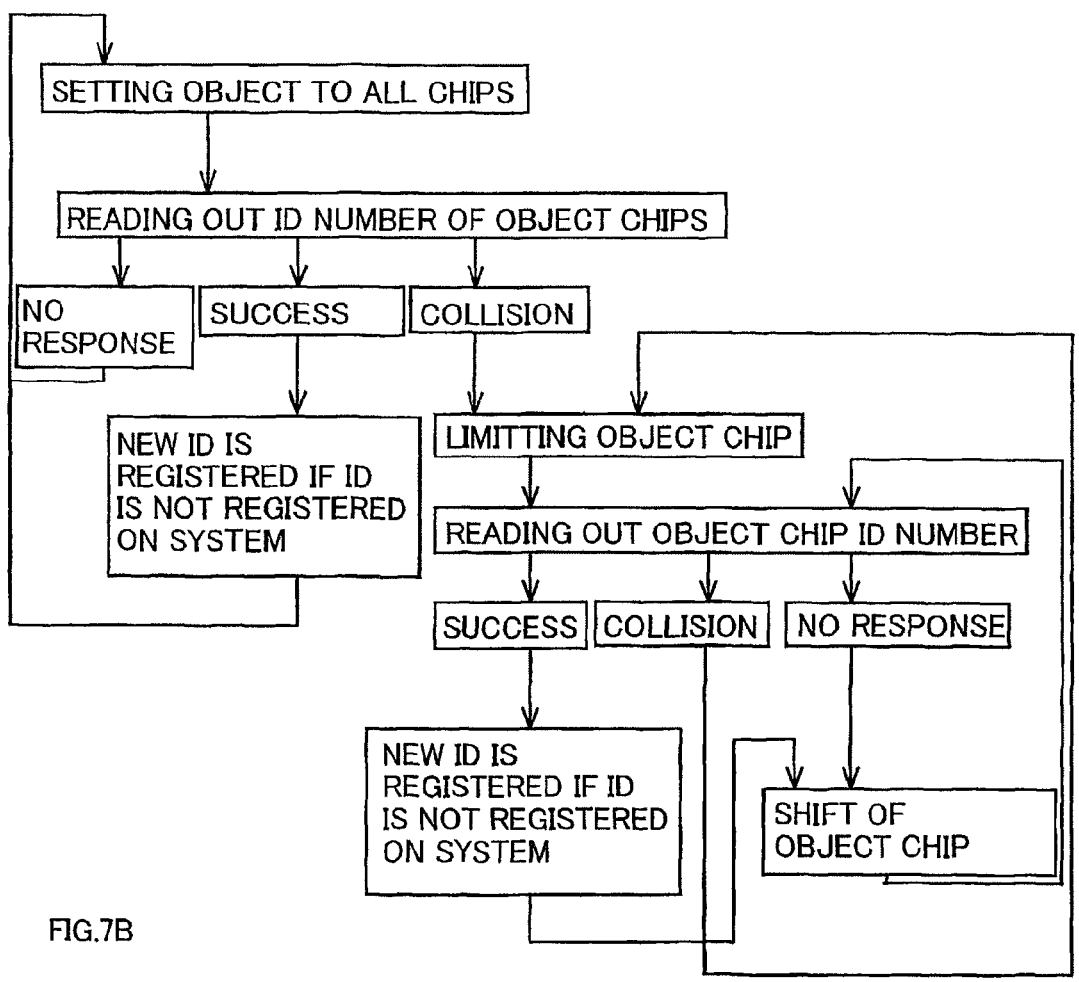

As shown in a flow chart of FIG. 7B, an ID number of a wireless processor within a communicable region can be obtained. FIG. 7B has a feature in a unit for interrogating only a part of wireless processors in addition to a unit for interrogating all the wireless processors as shown in FIG. 7A. For example, it is assumed that an ID number can be masked by bit and a wireless processor accepts a command that a response is made when an unmasked bit matches. Then, by reducing the wireless processors to be interrogated, the ID number can be obtained.

In specific, the system reads an ID number from a wireless processor having an arbitrary ID number. That is, all bits of the ID number are masked and read. When there is no collision, a similar process to FIG. 7A is performed. When there is a collision, the ID numbers are divided and one group is chosen (limitation of a chip) and read again. In the case where there is no response, another group of the divided groups is chosen (shift of a chip) and read again, and then all the Ids are swept. When reading is succeeded, the obtained ID number is registered in the system when it is a new number, and a chip is shifted when it is already registered. Moreover, when there is a collision, the ID number is further divided and limited, thus reading is performed again.

For example, provided that a collision occurs with all the IDs each having an ID number of 16 bits, 15 bits are masked (or one bit of the ID number is specified) and the left one bit is read twice. In the case where there is a collision, the number of bits to be masked is reduced by one bit, and reading is repeatedly performed.

Alternatively, in the case where a collided bit can be determined, a value thereof is limited to 0 or 1, thereby reading is performed again.

In this manner, by specifying by one bit to search all the IDs, an ID number can be obtained rapidly.

Heretofore described is the case where a wireless processor includes an ID number as nonvolatile data, however, a plurality of chips can be controlled relatively to a wireless processor without a unique ID number. For example, a wireless processor may have an ID number stored in a volatile memory so that the ID number is randomly set when entering a communicable region. By using an ID number of as many as 32 bits, a probability that ID numbers match between different chips is substantially 0%. This ID number does not change within the communicable region; therefore, it can be used as an ID number in the system.

A mode to drive a plurality of wireless processors by one wireless processor interface is preferable in downsizing of a semiconductor device. In particular, such a structure is preferable in the case where the performance of wireless processor is impeded by the performance of an internal CPU. On the other hand, in the case where the performance of the wireless processor is impeded by data transfer speed, it is preferable to provide a plurality of wireless processor interfaces in order to improve the performance.

A plurality of wireless processors can be typically controlled by a time division method. Alternatively, a method for dividing the frequency and a method for spatially dividing can be employed as well.

Embodiment Mode 4

It is one of the features of this system that a processor can be connected wirelessly, which allows processors to be easily increased in the system. By increasing processors in this manner, a parallel computation using the plurality of processors can be realized. In this embodiment mode, an example of parallel computation is described with a processor incorporated in the main body as a master and the plurality of wireless processors as slaves.

Not only in a wireless processor, a parallel computation is often impeded in performance due to a data transfer speed. Therefore, a program with less data transfer between processors is suitable for a parallel computation. An example of such a program is a Monte Carlo method which is a means of statistical evaluation by using random numbers.

The Monte Carlo method is a method of evaluating a true value by repeating a statistical process using random numbers. For example, a probability is obtained that a coordinate (x, y) determined by a pair of uniform random numbers each of which is 0 to 1 is included in a figure included in a square of 1 on a side, thereby an area S of the figure is evaluated. When the coordinate is included in the figure, a value of 1 is obtained, while otherwise a value of 0 is obtained. Provided that the coordinate is included k times in n times, the area of the figure is evaluated to be approximately k/n. An error of the evaluation is smaller as n becomes larger, and decreases by $1/(\sqrt{n})$.

For example, by copying a program for determining if (x, y) is included in the figure, which corresponds to a statistic process, into an internal memory of each of a plurality of wireless processors as slaves, the Monte Carlo calculation can be performed independently by simply obtaining random numbers externally. In the case where the coordinate is included in the figure k times in n times of random numbers obtained from outside, the plurality of wireless processors transmit values of n and k to outside. Then, based on the results (N times) of all the wireless processors, the area of the figure can be finally obtained with an error of approximately $1/(\sqrt{N})$.

In such a program, data transfer between the processors is little, thus a parallel computation can be executed efficiently. It is to be noted that the master controls the plurality of slaves; however, the master may also perform the Monte Carlo calculation similarly to the slaves in the meantime.

Embodiment Mode 5

It is one of the features of this system that a processor can be connected wirelessly, which allows processors to be increased easily in the system. In this embodiment mode, an example of providing a non-compatible CPU as a wireless processor is described as an application example of such a system.

There are various kinds of CPUs such as Pentium (registered trademark), however, each of them has a different instruction set, and thus a program as high in level as a machine language cannot be shared among them. On the other hand, there are many cases where it is desirable that both application software of different CPUs can be used. In view of such a problem, a processor non-compatible with a main processor is additionally provided as a wireless processor of the invention, so that software for the added processor can be executed.

Figure 8:
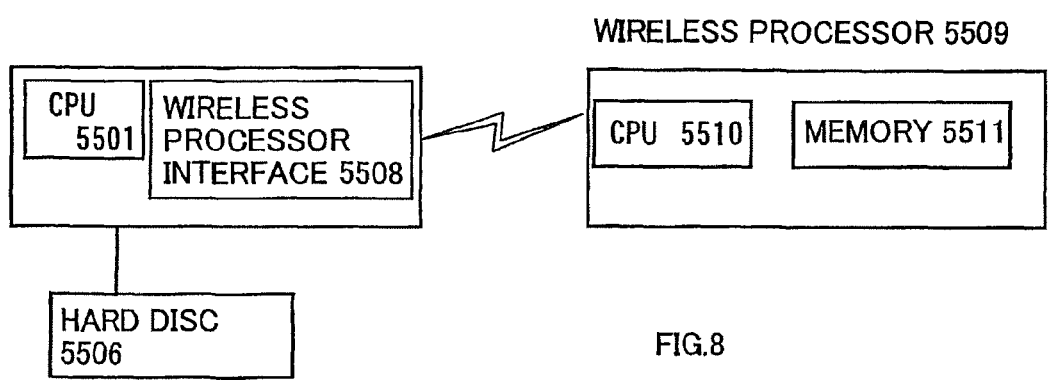
FIG. 8 is a diagram showing a wireless processor of the invention which is non-compatible with a main processor.

FIG. 8 shows a mode, although in actuality, a process in a wireless processor interface is required more or less because application software is normally executed by the operation system (OS) and data structures are different.

In FIG. 8, a CPU 5501 of a main body and a CPU 5510 in a wireless processor interface 5509 are not compatible with each other and a hard disc 5506 stores software and data for both the CPU 5501 and the CPU 5510. A system is constructed in an operation system which operates in the CPU 5501. The wireless processor 5509 is recognized by the operation system, and then embedded into or separated from the system. That is, the CPU 5510 is controlled by the operation system.

In the case where software which operates in the CPU 5510 is executed in such a structure, the operation system invokes the CPU 5510 to execute the software. The CPU 5510 transfers a program and data to a memory 5511 in the wireless processor, thereby the program is executed. The wireless processor interface 5508 controls so that the CPU 5510 can executes the program and transfer data with the operating system smoothly.

In this manner, by increasing a processor non-compatible with a processor of the main body, such a system can be constructed that software for the increased wireless processor can be executed in addition to normal software.

Embodiment Mode 6

In this embodiment mode, an example where specific application software is installed is described as an application example of a wireless processor.

For example, in the case of portably using a wireless processor which is installed with certain application software, the application software can be used only by mounting (attaching etc.) the wireless processor to a semiconductor device which includes a corresponding wireless processor interface.

A license mode that can prevent illegal copies can be realized by giving a license as hardware so that software stored therein cannot be read. Conventionally, when releasing software using a CD-ROM, the software could be illegally installed in a plurality of hardware. In order to prevent such a problem, a trouble has to be taken in registering a serial number of the hardware.

By giving a license by a wireless processor of the invention as hardware, a license mode can be realized that an illegal installation can be prevented and no such procedure as to register a serial number is required.

A mode where specific application software is installed is described as an application example of a wireless processor. For example, in the case of portably using a wireless processor which is installed with certain application software, the application software can be used only by mounting (attaching etc.) the wireless processor to an electronic device which includes a corresponding wireless processor interface.

A license mode that can prevent illegal copies can be realized by giving a license to each wireless processor which is installed with specific application software so that the installed software cannot be read.

Conventionally, when releasing application software, a CD-ROM or a network has been normally used. However, a method to give a license only to software is not preferable since the software can easily be copied illegally. In order to prevent such a problem, a trouble has to be taken in registering a serial number of the hardware.

As described above, by giving a license to each wireless processor which is installed with specific application software, the wireless processor is not required to load the stored software to outside, for execution, which makes it substantially impossible to copy the software illegally. Therefore, it is unlikely that more than wireless processors given licenses are produced illegally. Further, by attaching the wireless processor to be mounted on the system, the wireless processor can be used. Thus, such a mode is realized where only one license is required in the case of using a plurality of personal computers and serial numbers are not required to be registered for all the personal computers to be used.

Embodiment Mode 7

In this embodiment mode, a mode of a wireless memory is described.

Figure 9:
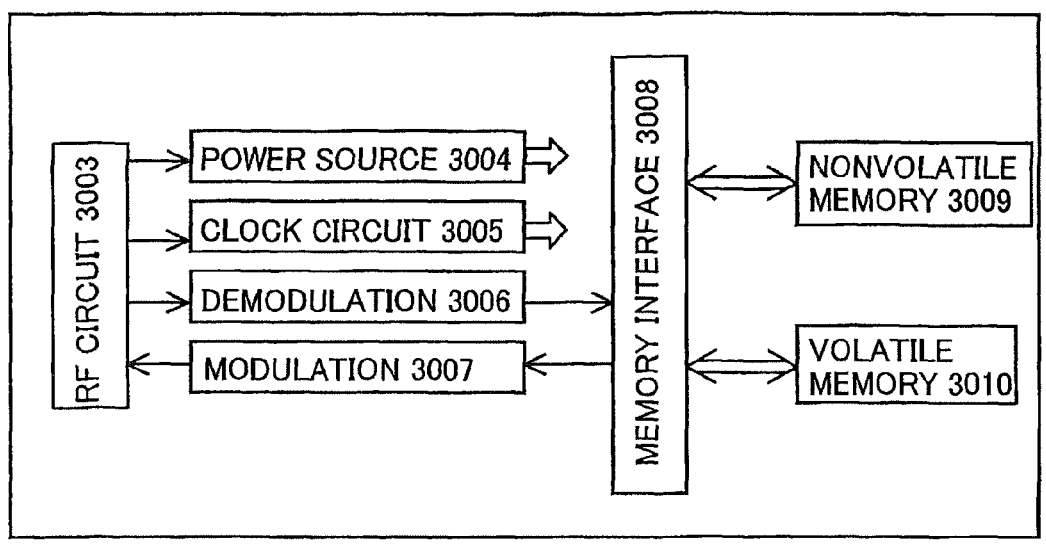
FIG. 9 is a diagram showing a wireless memory of the invention.

FIG. 9 shows a typical circuit configuration of a wireless memory 3000. In FIG. 9, the wireless memory 3000 includes an RF circuit 3003, a power source circuit 3004, a clock generating circuit 3005, a data demodulation circuit 3006, a load modulation circuit 3007, a memory interface 3008, and memories 3009 and 3010. For the memories 3009 and 3010, a nonvolatile memory and a volatile memory can be used respectively.

The wireless memory 3000 can be supplied with a power and transmit and receive data through electromagnetic waves through an antenna included in the RF circuit. Furthermore, one of a light detecting element and a light emitting element may be incorporated as a data transmission/reception unit so that infrared data communication thereby can be performed.

When electromagnetic waves are supplied to the RF circuit 3003, power is generated in the power source circuit 3004, a clock signal is generated in the clock generating circuit 3005, and data is demodulated in the data demodulation circuit 3006 respectively. Moreover, a load modulation in accordance with transmitted data is performed in the load modulation circuit 3007. The memory interface 3008 controls data communication between an external device, the nonvolatile memory 3009, and the volatile memory 3010, and reads and writes data in accordance with the received instruction, address, and data.

It is preferable that the invention incorporate a nonvolatile memory in order to hold data even when a power is not supplied. In the case where a battery is incorporated, a volatile memory only may be provided without providing a nonvolatile memory. The nonvolatile memory 3009 is typically a flash memory and an EEPROM. For a memory element, a floating gate transistor, a silicon dot structure transistor, a ferroelectric memory element and the like can be used. As a temporary memory such as a work memory, a volatile memory such as an SRAM and a DRAM may be provided as well.

It is to be noted that a wireless memory can be formed on a plastic substrate or a plastic film substrate (these may be collectively referred to as a flexible substrate). Specifically, the RF circuit 3003, the power source circuit 3004, the clock generating circuit 3005, the data demodulation circuit 3006, the load modulation circuit 3007, the memory interface 3008, and the memories 3009 and 3010 (these correspond to a high functional integrated circuit) can be formed so as to have an element forming region which includes a transistor including at least a channel forming region formed of at least one semiconductor film among semiconductor films separated into islands with a thickness of 10 to 200 nm formed over an insulating surface. As a specific transistor, a thin film transistor (TFT) can be used. The antenna included in the RF circuit may be fixed on a flexible substrate such as a plastic substrate or may be formed separately from the substrate and connected thereto. A detailed manufacturing method will be described in Embodiment Mode 12 or 13. As a result, a wireless processor which is superior in shock resistance and flexibility can be obtained.

Figure 10:
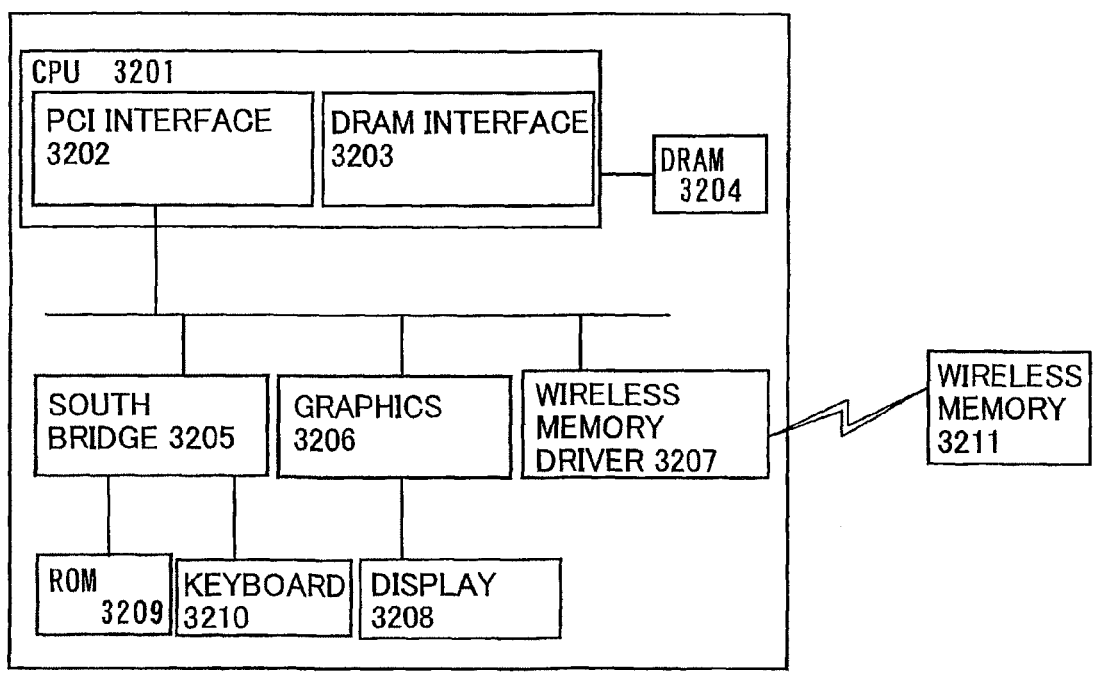
FIG. 10 is a diagram showing a wireless memory of the invention.

Next, FIG. 10 shows a configuration example of a semiconductor device, in which a wireless memory can be incorporated in a system. A semiconductor device 3200 shown in FIG. 10 is typically a personal computer. The semiconductor device 3200 includes an arithmetic unit (hereinafter referred to as a CPU as a function as a so-called CPU is included) incorporating a PCI interface 3202 and a DRAM interface 3203, a DRAM 3204, a graphics 3206 connected to a PCI bus, a display connected to the graphics 3206, a south bridge 3205, a ROM 3209 and a keyboard 3210 connected to the south bridge 3205, a wireless memory driver 3207 (hereinafter also simply referred to as a driver) and the like. The wireless memory driver 3207 drives a wireless memory 3211 wirelessly.

It is to be noted that a mode where the wireless memory driver 3207 is connected to a PCI bus is shown in FIG. 10; however, the wireless memory driver 3207 may be connected to a CPU or a south bridge.

The semiconductor device 3200 may be various semiconductor devices incorporating a CPU and an ASIC, such as a PDA, a game machine, and a DVD as well as a personal computer.

It is one of the features of the invention that a power is supplied and data is transferred wirelessly. Accordingly, a conventional card type semiconductor memory which is inserted and pulled out is not required, but a memory can be mounted by only placing, for example, attaching a wireless memory at a communicable place with a driver. Further, reliability is improved by being wireless. Moreover, a defective connection of a connector and the like can be eliminated and a defect which occurs in handling the device caused by a wiring which connects each device can be eliminated.

Figure 11:
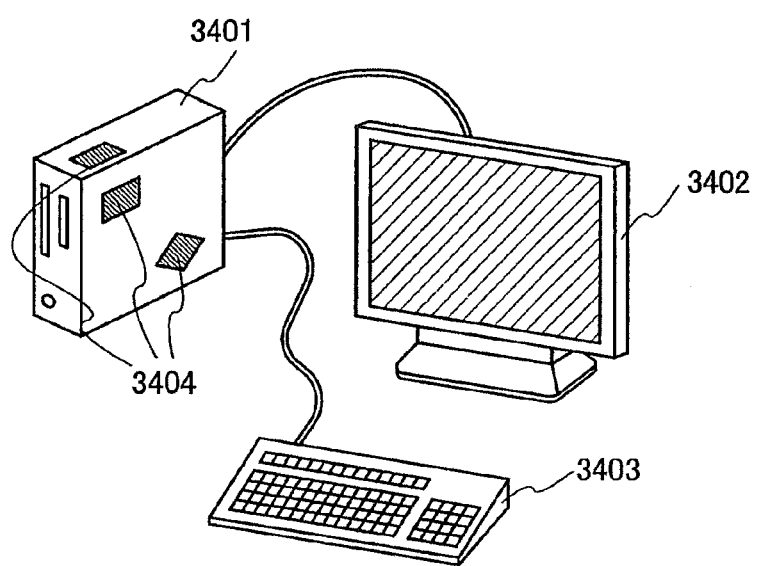
FIG. 11 is a view showing a wireless memory of the invention.

It is preferable that a personal computer be designed to have a driver communicable in the range of 1 mm to 50 cm so that the driver can recognize a wireless memory no matter where it is attached on the body of the personal computer. It is a convenient mode of a wireless memory to be attached to a main body with a magnet and the like. As a result, a memory can be incorporated, for example, by only attaching wireless memories 3404 to a main body 3401 of a personal computer. In this manner, wireless transmission and reception of power or signals can add high value to a memory and a semiconductor device. FIG. 11 is a schematic diagram of a personal computer including the main body 3401, a display 3402, a keyboard 3403, and wireless memories 3404.

Embodiment Mode 8

Figure 12:
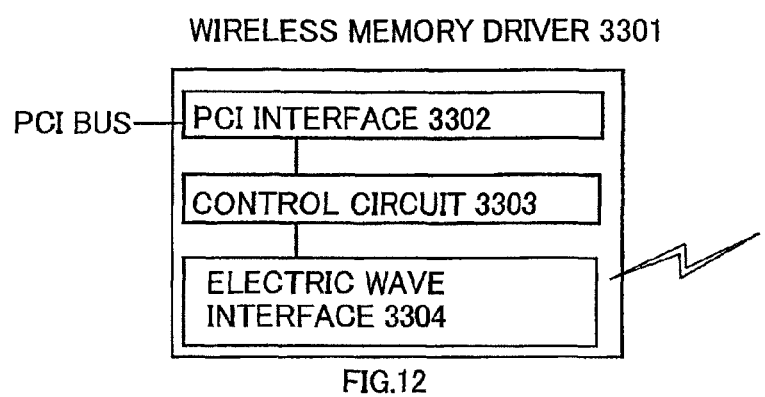
FIG. 12 is a diagram showing a wireless memory of the invention.

In this embodiment mode, a circuit configuration of a driver of a wireless memory is described. A wireless memory driver 3301 shown in FIG. 12 has a structure connected to a PCI bus, including a PCI interface 3302, a control circuit 3303, and an electric wave interface 3304.

Figure 5:
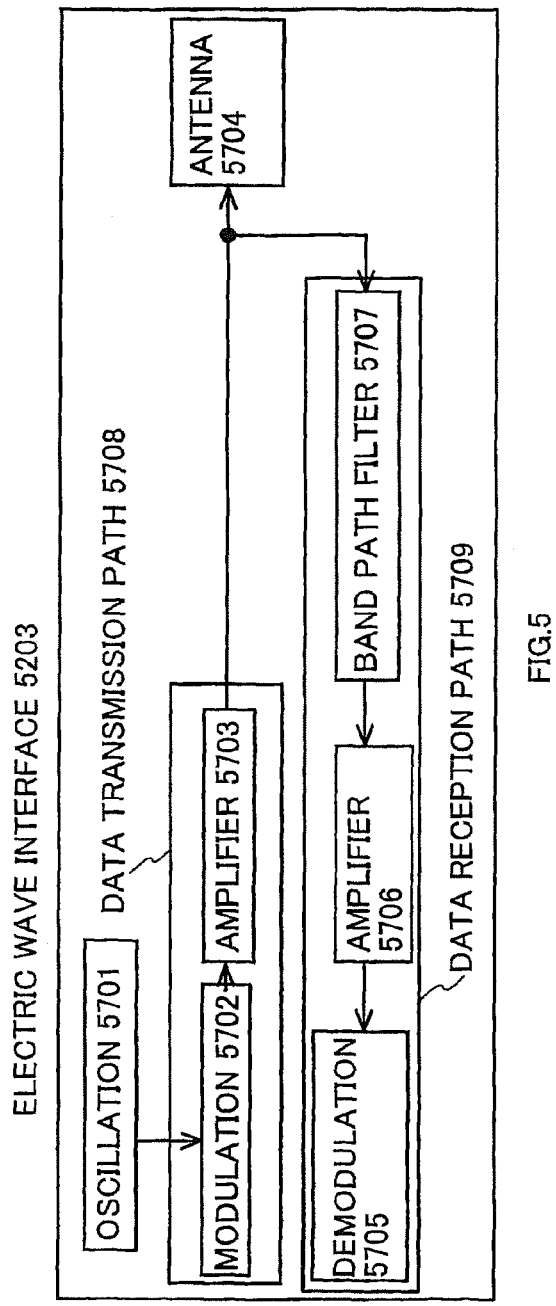
FIG. 5 is a diagram showing an electronic wave interface of the invention.

The electric wave interface 3304 which depends on a communication method generally has the same configuration as the electric wave interface 5203 shown in FIG. 5. It is to be noted that a communication method applicable to the invention is an electromagnetic induction method, a microwave method, and the like. The electric wave interface 5203 shown in FIG. 5 includes the data transmission path 5708, the data reception path 5709, the oscillation circuit 5701, and the antenna 5704. When transmission data is inputted to the data transmission path 5708, a signal from the oscillation circuit 5701 is modulated in the modulation circuit 5702, amplified in the amplifier circuit 5703, and transmitted to the antenna 5704. On the other hand, when a reception signal from the antenna 5704 is inputted to the data reception path 5709, only a response signal from a wireless memory is received by the band path filter 5707. The received signal is amplified in the amplifier circuit 5706, demodulated in the demodulation circuit 5705, and transmitted to the control circuit 5202. Examples of a control signal are an enable signal, a frequency control signal, a stand-by signal and the like.

The control circuit 3303 is in charge of communication with application software which controls a wireless memory from a main body of system, execution of instructions, communication with a wireless memory, and coding and decoding of signals. Further, the control circuit 3303 processes encryption and decryption, recognition, and collision as required. In order to make sure that communication is made with the same wireless memory, it is preferable that an ID number given to a wireless memory be regularly read and recognized, and then check sum (for example, parity check) be performed relatively to communication data therebetween.

The PCI interface 3302 is an interface used for communicating data between the control circuit 3303 and a main body of system through a PCI bus. In this embodiment mode, the PCI interface 3302 is connected to a PCI bus; however, a wireless memory can be incorporated in the main body of system with other bus by changing the PCI bus interface portion to a bus interface suitable for a bus to be connected.

Embodiment Mode 9

Figure 13:
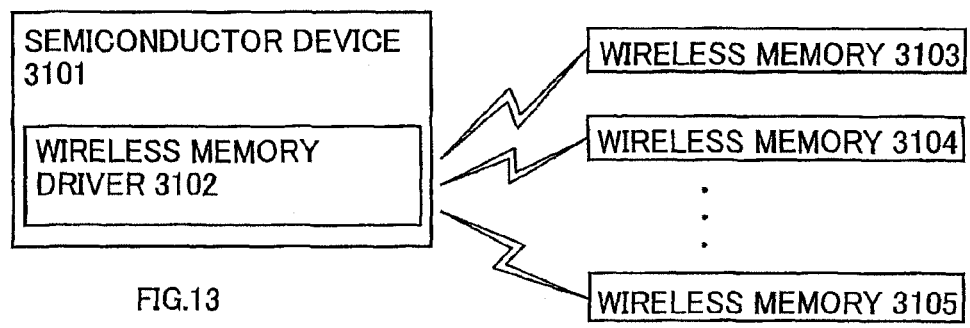
FIG. 13 is a diagram showing a wireless memory of the invention.

According to the invention, a wireless memory is not required to be inserted and pulled out and a plurality of wireless memories can be driven by one driver, which is described in this embodiment mode with reference to FIG. 13.

FIG. 13 shows a system including a semiconductor device 3101 which has a wireless memory driver 3102 and a plurality of wireless memories 3103 to 3105.

Description is made on a configuration where the wireless memory driver 3102 recognizes and controls a plurality of wireless memories. First, the case where each of the wireless memories has a unique ID number is described, and then the case where the wireless memories are identical and do not have unique ID numbers is described. In either case, each of the wireless memories has an ID number which is recognizable in the system when the wireless memory is incorporated in the system. Reading the ID number, the system can selectively communicate with the wireless memory having the ID number. Such a selective communication can be realized in the case where the wireless memory accepts such a command that the wireless processor communicates data only when the ID number is matched.

In order to recognize a plurality of wireless memories, ID numbers which are recognizable in the system are required to be obtained as described above. For example, an ID number of a wireless memory within a communicable region can be obtained by a method as shown in a flow chart of FIG. 7A. First, a system regularly reads ID numbers of all wireless memories within a communicable region. In the case where there are no wireless memories in the communicable region, no response is made, thus the system processes no data. In the case where one or more wireless memories are in the communicable region, the system may be able to read an ID number normally or may fail to read an ID number due to a collision. In the case where the ID number can be read normally, the ID number can be successfully obtained. When the read ID number is not registered in the system, it is newly registered therein. On the other hand, in the case where data fails to be read due to a collision, an ID may be read again.

According to the aforementioned method, in the case where a timing at which an ID number is transmitted from each wireless memory is common among a plurality of wireless memories, it is hard to avoid a collision of a plurality of wireless memories, thus it becomes difficult to obtain an ID number. In order that this method functions efficiently, a timing at which an ID number is transmitted is made different for each wireless processor. Alternatively, a timing at which an ID number is transmitted is changed every time reading is performed. In specific, a transmission timing is determined based on the ID number or based on a random number generated every time an ID number is read. According to this method, the driver may employ a method to use data with no collision among a plurality of pieces of received data at reception timings divided into a plurality of numbers.

As shown in a flow chart of FIG. 7B, an ID number of a wireless memory within a communicable region can be obtained. FIG. 7B has a feature in a unit for interrogating only a part of wireless memories in addition to a unit for interrogating all the wireless memories as shown in FIG. 7A. For example, it is assumed that an ID number can be masked by bit and a wireless memory accepts a command that a response is made when an unmasked bit matches. Then, by reducing the wireless memories to be interrogated, the ID number can be obtained.

In specific, the system reads an ID number from a wireless memory having an arbitrary ID number. That is, all bits of the ID number are masked and read. When there is no collision, a similar process to FIG. 7A is performed. When there is a collision, the ID numbers are divided and one group is chosen (limitation of a chip) and read again. In the case where there is no response, another group of divided groups is chosen (shift of a chip) and read again, and then all the IDs are swept. When reading is succeeded, the obtained ID number is registered in the system when it is a new number, and a chip is shifted when it is already been registered. Moreover, when there is a collision, the ID number is further divided and limited, thus reading is performed again.

For example, provided that a collision occurs with all the IDs each having an ID number of 16 bits, 15 bits are masked (or one bit of the ID number is specified) and the left one bit is read twice. In the case where there is a collision, the number of bits to be masked is reduced by one bit, and reading is repeatedly performed.

Alternatively, in the case where a collided bit can be determined, a value thereof is limited to 0 or 1, thereby reading is performed again.

In this manner, by specifying by one bit to search all the IDs, an ID number can be obtained rapidly.

Heretofore described is the case where a wireless memory includes an ID number as nonvolatile data; however, a plurality of chips can be controlled relatively to a wireless memory without a unique ID number. For example, a wireless memory may have an ID number stored in a volatile memory so that the ID number is randomly set when entering a communicable region. By using an ID number of as many as 32 bits, a probability that ID numbers match between different chips is substantially 0%. This ID number does not change within the communicable region; therefore, it can be used as an ID number in the system.

Many systems including a personal computer transfer data by using a bus; therefore, they hardly access a plurality of memories at the same time. In such systems, a mode to incorporate one driver to drive a plurality of wireless memories is suitable and superior in downsizing of a semiconductor device. It is needless to say that a plurality of drivers may be provided as well.

Embodiment Mode 10

In this embodiment mode, description is made on a comparison of a wireless memory with a wireless tag of the invention.

A wireless memory of the invention communicates through an antenna and includes a memory, thus has a rather close structure to a wireless tag. A wireless tag, however, necessarily has a different ID for distinguishing an object to which the tag is attached. As for a wireless memory of the invention, on the other hand, not all memories are not necessarily given different IDs. For example, such a method may be employed that a driver writes an ID number to a volatile memory incorporated in a wireless memory once the wireless memory enters a communicable region of the driver.

A wireless memory is different than a wireless tag in specifications and applications such as specifications of communication, required memory capacitance, continuous operation time and the like. A wireless memory is advantageous in that a design freedom is high as it is only required to match the specifications of driver. Further, the wireless memory is advantageous in that it has large memory capacitance and can continuously operate for a long time as it is used while being connected.

Embodiment Mode 11

In this embodiment mode, a mode that specific software is installed in a wireless memory is described.

For example, by portably using a wireless memory installed with certain application software, the application software can be used only by mounting (attaching, etc.) the wireless memory to a semiconductor device to which a driver of the wireless memory corresponds. This is similar to the usage of CD-ROMs; however, a wireless memory is superior than a CD-ROM in that reliability is high because it is used wirelessly and it can easily be mounted.

Embodiment Mode 12

In this embodiment mode, a step of manufacturing a high functional integrated circuit by an SPOP method using a thin film transistor as a transistor is described.

First, a metal film 11 is formed over a first substrate 210 which has an insulating surface as shown in FIG. 14A. It is to be noted that the first substrate which is only required to have resistance high enough to resist a peeling step later can be formed of a glass substrate, a quartz substrate, a ceramics substrate, a silicon substrate, a metal substrate, or a stainless substrate. The metal film can be formed of a single layer formed of an element selected from W, Ti, Ta, Mo, Nd, Ni, Co, Zr, Zn, Ru, Rh, Pd, Os, and Ir, an alloy material or a compound material having the aforementioned element as a main component, or stacked layers of these. The metal film can be manufactured by a sputtering method using a metal target. It is to be noted that the metal film may formed with a thickness of 10 to 200 nm, or preferably 50 to 75 nm.

A nitride film of the aforementioned metal (for example, tungsten nitride and molybdenum nitride) may be used instead of the metal film. An alloy film (for example, an alloy of W and Mo: $W_xMo_{1-x}$) of the aforementioned metal may be used instead of the metal film. In this case, the film may be formed by sputtering using a plurality of targets such as a first metal (W) and a second metal (Mo) or an alloy target of the first metal (W) and the second metal (Mo). Furthermore, nitrogen or oxygen may be added to the metal film as well. As an adding method, nitrogen or oxygen may be ion implanted to the metal film. Alternatively, it may be added by a sputtering method in a chamber of nitrogen or oxygen atmosphere, or a nitride metal may be used as a target.

In this manner, by appropriately setting the forming method of the metal film, a peeling step can be controlled, which leads to increase the process margin. In specific, a heating temperature and necessity of heat treatment can be controlled.

After that, a peeled layer 12 including an element forming region is formed over a metal film 11. This peeled layer 12 is formed by stacking an oxide film containing silicon to be in contact with the metal film. The peeled layer may include an antenna as well. It is preferable that the peeled layer 12 be provided with an insulating film containing nitrogen, such as a silicon nitride (SiN) film, and a silicon nitride oxide (SiON or SiNO) film in a region in contact with the metal film in order to prevent impurities and dusts entering from the metal film and the substrate. The insulating film functions as a base film of a thin film transistor.

The oxide film containing silicon may be formed of silicon oxide, silicon oxynitride and the like by a sputtering method and a CVD method. It is to be noted that the oxide film containing silicon is preferably twice as thick or thicker than the metal film. In this embodiment mode, the silicon oxide film is formed with a thickness of 150 to 200 nm by a sputtering method using a silicon target.

When forming the oxide film containing silicon, over the metal film is formed an oxide (metal oxide) 13 containing the metal. The metal oxide may be a thin metal oxide formed over the surface of the metal film by treatment with a solution containing sulfuric acid, hydrochloric acid, or nitric acid, a solution obtained by mixing sulfuric acid, hydrochloric acid, or nitric acid with a hydrogen peroxide solution, or ozone water. As other methods, oxidation may be carried out by plasma treatment in an oxygen atmosphere, or with ozone generated by ultraviolet ray irradiation in an atmosphere containing oxygen. Further, the oxide film may be formed by heating with a clean oven at around 200 to 350° C.

The metal oxide film may be formed with a thickness of 0.1 nm to 1 μm, preferably 0.1 to 100 nm, and more preferably 0.1 to 5 nm.

It is to be noted that an oxide film containing silicon, a base film and the like are collectively referred to as an insulating film. That is, the metal film, the metal oxide film, the insulating film, and the semiconductor film are stacked. The metal film and the metal oxide film can be referred to as a peeling layer.

Through predetermined manufacturing steps, a thin film transistor (TFT) having at least a channel forming region is formed of a semiconductor film separated into islands with a thickness of 10 to 200 nm is peeled over a semiconductor film. This semiconductor element forms the RF circuit 5001, the power source circuit 5002, the clock generating circuit 5003, the data demodulation circuit 5004, the load modulation circuit 5005, the CPU interface 5006, the CPU 5007, and the memory 5008 shown in FIG. 1. Further, the RF circuit 3003, the power source circuit 3004, the clock generating circuit 3005, the data demodulation circuit 3006, the load modulation circuit 3007, the memory interface 3008, the nonvolatile memory 3009, and the volatile memory 3010 shown in FIG. 9 can be formed. As a protective film for protecting the semiconductor element, an insulating film containing carbon such as a DLC film or a carbon nitride (CN) film, or an insulating film containing nitrogen such as a silicon nitride (SiN) film or a silicon nitride oxide (SiNO or SiON) film is preferably formed.

After forming the peeled layer 12 as described above, the metal oxide is crystallized by appropriate heat treatment after forming the metal oxide, in specific. For example, in the case of using W (tungsten) for the metal film, the metal oxide of $WO_x$ (x=2 to 3) is crystallized by heat treatment at 400° C. or higher. The temperature and necessity of such heat treatment may be determined according to a selected metal film. That is, the metal oxide may be crystallized for ease in peeling as required.

By heating after forming a semiconductor film included in the peeled layer 12, hydrogen in the semiconductor film can be diffused. Due to this hydrogen, a valency of the metal oxide may change.

Further, the heat treatment may be reduced in the number of steps by utilizing the manufacturing step of semiconductor elements. For example, heat treatment can be performed by using a heating furnace and laser irradiation in the case of forming a crystalline semiconductor film.

Subsequently, the peeled layer 12 is attached to a support substrate 14 with a first adhesive 15 as shown in FIG. 14B. It is to be noted that the support substrate 14 is preferably a substrate which is higher in resistance than the first substrate 210. As the first adhesive 15, an adhesive which can be peeled, such as an ultraviolet peeling type adhesive which is peeled by an ultraviolet ray, a heat peeling type adhesive which is peeled by heat, an aqueous adhesive which is peeled by water, or a double-faced tape may be used.

The first substrate 210 provided with the metal film 11 is peeled physically (FIG. 14C). Although not shown in the schematic diagrams of FIGS. 14A to 14E, the first substrate 210 is peeled within the layer of the metal oxide or a boundaries (interfaces) of opposite surfaces of the metal oxide. The boundaries of the opposite surfaces of the metal oxide are an interface between the metal oxide and the metal film or an interface between the metal oxide and the peeled layer. The first substrate 210 is peeled at any of the aforementioned interfaces. In this manner, the peeled layer 12 can be peeled off the first substrate 210.

For the ease in peeling at this time, a portion of a substrate may be cut so as to scratch the peeling interface at the cut surface by a cutter or the like, that is around the interface between the metal film and the metal oxide.

Next, as shown in FIG. 14D, the peeled layer 12 which is peeled is attached with a second adhesive 16 to a second substrate (for example, a flexible substrate such as a plastic substrate) 110 to be transferred and fixed thereto. In the case where an antenna is formed in the peeled layer 12, the element forming region and the antenna are fixed on the second substrate at the same time. As the second adhesive 16, an ultraviolet ray curable resin, in specific an adhesive such as an epoxy resin based adhesive and a resin additive, or a double-faced tape and the like are to be used. In the case where the second substrate itself is adhesive, the second adhesive is not required.

As the second substrate, a plastic material and the like such as polyethylene terephthalate, polycarbonate, polyarylate, and polyether sulfone can be used. Such second substrate is referred to as a plastic substrate. Such plastic substrate has flexibility and is light in weight. By applying coating treatment to the plastic substrate, depressions and projections over the surface may be reduced or hardness, resistance, and stability may be enhanced.

Subsequently, the first adhesive 15 is removed and the support substrate 14 is peeled off (FIG. 14E). In specific, the substrate may be irradiated with ultraviolet ray, heated, or rinsed in order to peel the first adhesive.

It is to be noted that the removal of the first adhesive and curing of the second adhesive may be carried out in one step. For example, in the case where a heat peeling type resin and a heat curable resin, or an ultraviolet ray peeling type resin and an ultraviolet ray curable resin are used for the first adhesive and the second adhesive respectively, the removing and the curing can be carried out by one time of heating or an ultraviolet ray irradiation.

As described above, a high functional integrated circuit fixed on a plastic substrate can be formed.

The metal oxide 13 may be all removed, or a part or most thereof may be scattered (left) under the peeled layer in the high functional integrated circuit. In the case where the metal oxide 13 is left, it may be removed by etching and the like and then fixed on a flexible substrate such as a plastic substrate. At this time, an oxide film containing silicon may be removed as well.

While an IC formed of a silicon wafer has a thickness of 50 µm, a high functional integrated circuit of the invention is formed quite thin as a semiconductor film separated into islands with a thickness of 10 to 200 nm is used. As a result, a wireless processor or a wireless memory of the invention can be quite thin, flexible, and lightweight. Further, a wireless processor or a wireless memory which is superior in shock resistance and flexibility can be obtained.

Moreover, back-grind treatment which may cause a crack or a mark of grind is not required unlike an IC formed of a silicon wafer. Thus, variations in thickness is about several hundreds nm at most since it depends on variations in forming a semiconductor film and the like. This is considerably smaller than the variations of several to several hundreds µm caused by the back-grind treatment.

By using the SPOP method in this manner, a substrate over which an element forming region is formed can be reused, which results in reducing the unit price of a processor or a memory. Further, a substrate over which an element forming region is formed is not required to transmit laser light, thus design freedom can be increased.

Embodiment Mode 13

In this embodiment mode, a method for fixing an element forming region to a flexible substrate in a different manner than the aforementioned embodiment modes is described.

Figure 15A:
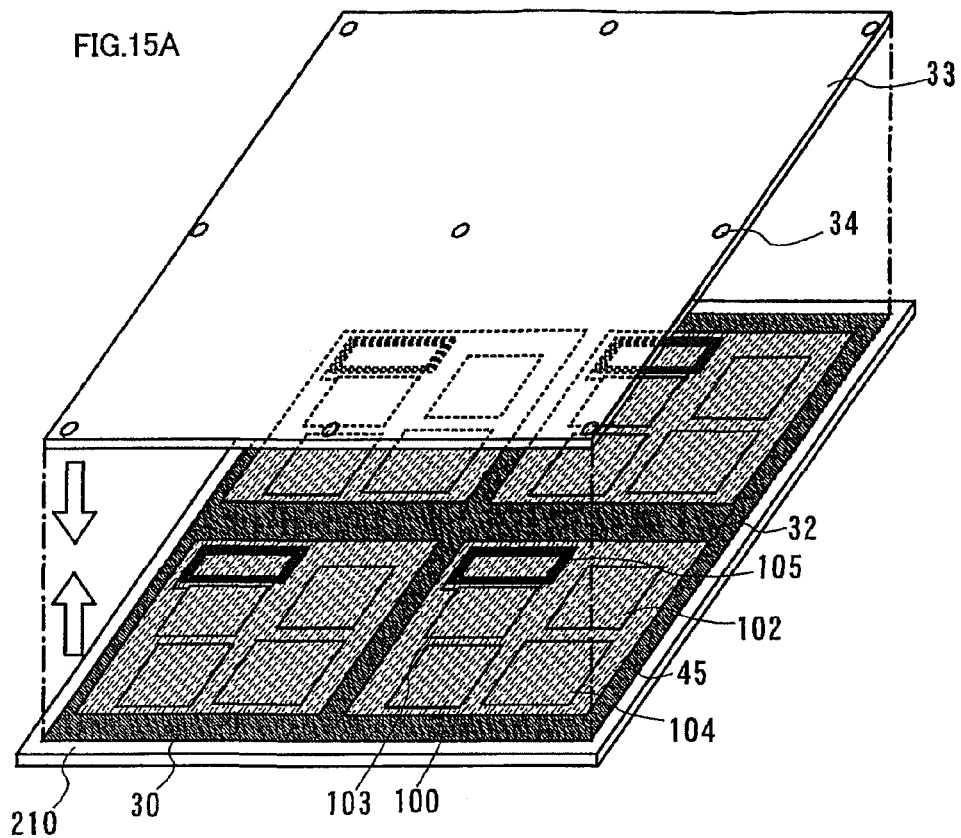
FIGS. 15A and 15B are diagrams showing a wireless processor or a wireless memory of the invention.

As shown in FIG. 15A, a peeling layer 30 and a peeled layer including an element forming region 45 are sequentially formed over an insulating substrate 210. In this embodiment mode, an antenna 105 may be formed over the element forming region 45. It is needless to say that configurations of the element forming region 45 and the antenna are not limited to these. The configuration or the manufacturing method of the peeled layer including the element forming region 45 is similar to Embodiment Mode 12; therefore, description thereon is omitted here.

The peeling layer 30 can be formed of a film containing silicon or a metal film. The film containing silicon may be formed of any of an amorphous semiconductor, a semi-amorphous semiconductor (also referred to as an SAS) in which an amorphous state and a crystalline state are mixed, or a crystalline semiconductor. It is to be noted that an SAS includes a micro-crystalline semiconductor in which a crystal grain of 0.5 to 20 nm can be observed in an amorphous semiconductor. The peeled layer 30 can be formed by a sputtering method, a plasma CVD method, or the like. The peeling layer 30 may be formed with a thickness of 0.03 to 1 µm, and may also be formed with a thickness of 0.03 µm or thinner as long as the thickness is acceptable for a deposition apparatus of the peeling layer.

The peeling layer containing silicon may be added an element such as phosphorus and boron. Further, the element may be activated by heat or the like. By adding these elements, response of the peeling layer, that is an etching rate can be improved.

Further, an insulating film is formed over the peeling layer in a region in contact with the peeling layer 30. The insulating film can function as a base film of a thin film transistor. As the insulating film, a single layer structure or a stacked-layer structure of an insulating film containing oxygen or nitrogen, such as silicon oxide ($SiO_x$), silicon nitride ($SiN_x$), silicon oxynitride ($SiO_xN_y$) (x>y), and silicon nitride oxide ($SiN_xO_y$) (x>y) (x, y=1, 2 . . . ) can be used. In the case of a stacked-layer structure of three layers, for example, a silicon oxide film, a silicon oxynitride film, and a silicon oxide film can be used as a first insulting film, a second insulting film, and a third insulating film respectively. These insulating films are preferably formed of silicon oxynitride films in consideration of an impurity diffusion from the insulating substrate (the first substrate) 210 and the like. However, the silicon oxynitride film is inferior in contact with the peeling layer and a semiconductor film of a TFT. Therefore, it is preferable to employ a stacked-layer structure of three layers of the peeling layer, the semiconductor layer, and a silicon oxide film which is superior in contact with the silicon oxynitride film.

In such a state, an opening portion (such as a groove or a hole) 32 is formed so as to expose the peeling layer 30 except in the element forming region 45. A support substrate 33 in which a hole 34 is formed is fixed on the insulating substrate 210 with an adhesive 38. The adhesive 38 may be a resin material such as an ultraviolet ray curable resin and a heat curable resin, a double-faced tape, and the like.

Figure 15B:
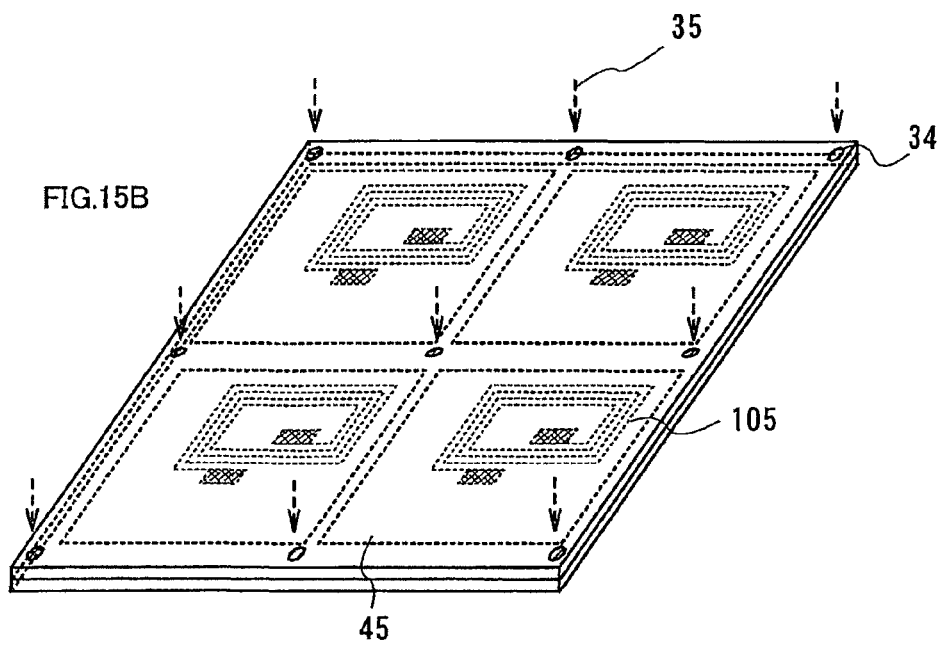

As shown in FIG. 15B, an etchant 35 is filled in the opening portion 32 through the hole 34. As a result, the peeling layer 30 can be removed. A metal film as the peeling layer can be removed at least by a reactant reacting with the etchant.

As the etchant, a gas or a liquid containing halogenated fluoride can be used. As halogenated fluoride, for example, $ClF_3$ (chlorine trifluoride) can be used. With such an etchant, the peeling layer 30 is selectively etched. In specific, the peeling layer 30 can be removed by using a low pressure CVD apparatus at a temperature of 350° C., a flow rate of $ClF_3$ at 300 sccm and a pressure of 6 Torr (6×133 Pa) for 3 hours.

In this manner, the peeling layer 30 is removed, the insulating substrate 210 is peeled off, thus the element forming region 45 can be fixed on the flexible substrate 110 such as a plastic substrate and a plastic film substrate by using an adhesive 111. As the adhesive, a resin material such as an ultraviolet ray curable resin and a heat curable resin, a double-faced tape, and the like can be used.

In the case of forming a wireless memory in this manner, the insulating substrate 210 can be reused, which can reduce the unit price of a wireless memory. Further, the insulating substrate 210 is not required to transmit laser light, therefore, the design freedom can be increased.

Embodiment Mode 14

In this embodiment mode, a method for fixing an element forming region to a flexible substrate by using a different peeling layer than that described in the aforementioned embodiment modes, and manufacturing steps of a thin film transistor are described.

In this embodiment mode, a metal is used for the peeling layer. As the peeling layer, a single layer or stacked layers formed of an element selected from W, Ti, Ta, Mo, Nd, Ni, Co, Zr, Zn, Ru, Rh, Pd, Os, and Ir, an alloy material containing the aforementioned element as a main component, or a compound material thereof can be used.

These metal films can be formed by a sputtering method, a plasma CVD method, and the like. In specific, when employing a sputtering method, the metal film may be formed over the first substrate with a metal as a target. The metal film may be formed with a thickness of 10 to 200 nm, or preferably 50 to 75 nm. A metal film which is nitrided (nitride metal film) may be used instead of the metal film. Furthermore, nitrogen or oxygen may be added to the metal film. For example, nitrogen or oxygen may be ion implanted to the metal film. Alternatively, it may be added by a sputtering method in a chamber of nitrogen or oxygen atmosphere, or a nitride metal may be used as a target. At this time, in the case of using a mixture of the aforementioned metals (for example, an alloy of W and Mo: $W_{(x)}Mo_{(1-x)}$) for the metal film, the metal film may be formed by a sputtering method using a plurality of targets such as a first metal (W) and a second metal (Mo) or an alloy of the first metal (W), and the second metal (Mo) in a deposition chamber.

Then, over the metal film is formed an oxide, a nitride, or a nitride oxide containing the aforementioned metal. The oxide, nitride, or the nitride oxide containing the aforementioned metal is sometimes referred to as a reactant collectively. For example, in the case of using W, Mo, or a mixture of W and Mo to the metal film, the oxide, nitride, or the nitride oxide containing the aforementioned metal are an oxide, a nitride, or a nitride oxide of W, Mo, or a mixture of W and Mo.

Such a reactant is formed when forming a film containing an oxide, a nitride, or a nitride oxide over the surface of the metal film.

In this embodiment mode, a silicon oxide film 212 is formed over a metal film 211 containing W as shown in FIG. 16A. Then, an oxide film containing W, for example, $WO_x$ (x=2 to 3) 213 (hereinafter also referred to as a reactant 213) is formed over the surface of the metal film 211 containing W. Similarly, by forming a silicon nitride film over the metal film 211 containing W, a nitride film containing W is formed. By forming a silicon nitride oxide film over the metal film 211 containing W, a nitride oxide film containing W can be formed.

The aforementioned oxide as a reactant may be formed by treating the metal film with a solution containing sulfuric acid, hydrochloric acid, or nitric acid, a solution obtained by mixing sulfuric acid, hydrochloric acid, or nitric acid with a hydrogen peroxide solution, or ozone water. As other methods, oxidation may be carried out, after forming the metal film, by plasma treatment in an oxygen atmosphere, or with ozone generated by ultraviolet ray irradiation in an atmosphere containing oxygen. Further, a thin oxide film may be formed by heat treatment using a clean oven at around 200 to 350° C.

By selecting the metal film and reactant formed in this manner, the etching rate can be controlled.

The reactant formed over the surface of the metal film in this manner may chemically change its state due to heat treatment of subsequent steps and the like. For example, in the case of forming an oxide film containing W, a valency of tungsten oxide ($WO_x$ (x=2 to 3)) changes.

Then, a metal film and a reactant containing the metal thereof can be used as the peeling layer.

After that, an insulating film 36 which functions as a base film of a thin film transistor is formed over the silicon oxide film 212. As the insulating film, a single layer structure or a stacked-layer structure of an insulating film containing oxygen or nitrogen, such as silicon oxide ($SiO_x$), silicon nitride ($SiN_x$), silicon oxynitride ($SiO_xN_y$) (x>y), and silicon nitride oxide ($SiN_xO_y$) (x>y) (x, y=1, 2 . . . ) can be used. In the case of a stacked-layer structure of two layers, a silicon nitride film 36a and a silicon oxynitride film 36b can be used as a first insulating film and a second insulating film respectively. With these insulating films, impurity dispersion from the insulating substrate 210 and the like can be reduced.

After that, a semiconductor film is formed and patterned into a predetermined shape, thereby an island-shape semiconductor film 214 is formed.

The semiconductor film 214 may be any one of an amorphous semiconductor, an SAS in which an amorphous state and a crystalline state are mixed, a micro-crystalline semiconductor in which a crystal grain of 0.5 to 20 nm can be observed in an amorphous semiconductor, or a crystalline semiconductor.

In this embodiment mode, an amorphous semiconductor film is formed and then crystallized by heat treatment so as to form a crystalline semiconductor film. The heat treatment may be performed by using a heating furnace, laser irradiation, irradiation of light generated from a lamp instead of laser light (hereinafter referred to as a lamp annealing), or a combination of them.

In the case of laser irradiation, a continuous wave laser beam (CW laser beam) or a pulsed wave laser beam (pulsed laser beam) can be used. As the laser beam, a beam emitted from one or plural kinds of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, and a gold vapor laser, can be used. A laser beam having a fundamental wave of such lasers or a second to a fourth harmonic of the fundamental wave is irradiated to obtain a crystal with a large grain size. Typically, for instance, the second harmonic (532 nm) or the third harmonic (355 nm) of an Nd:$YVO_4$ laser (fundamental wave of 1064 nm) can be used. In this case, the power density of about 0.01 to 100 MW/cm² (preferably, 0.1 to 10 MW/cm²) is required. The scanning rate is approximately set about 10 to 2000 cm/sec to irradiate the semiconductor film.

An incident angle θ of the laser beam against the semiconductor film may be set 0<θ<90. As a result, interference of the laser beam can be prevented.

A continuous wave fundamental harmonic laser beam and a continuous wave higher harmonic laser beam may be emitted. Alternatively, a continuous wave fundamental harmonic laser beam and a pulsed wave higher harmonic laser beam may be emitted. By emitting a plurality of laser beams, energy can be supplied.

A laser beam, which is a pulse oscillation laser beam, and which can oscillate laser at an oscillation frequency capable of emitting laser light of a next pulse during the period between melting due to laser light and solidifying of the semiconductor film can also be used. By oscillating the laser beam at such the frequency, crystal grains that are continuously grown in the scanning direction can be obtained. A specific oscillation frequency of the laser beam is 10 MHz or higher. A notably higher frequency band is used than a frequency band of several tens to several hundreds Hz that is generally used.

The laser beam may be emitted in the presence of an inert gas such as a rare gas or nitrogen. Accordingly, a rough surface of a semiconductor due to the laser beam irradiation, flatness of the semiconductor surface can be improved, and variations of a threshold value due to variations of interface state density can be prevented.

Alternatively, a microcrystalline semiconductor film may be formed by using $SiH_4$ and $F_2$, or $SiH_4$ and $H_2$, and the microcrystalline semiconductor film may be crystallized by laser irradiation as mentioned above.

In the case of using a heating furnace as another heat treatment, an amorphous semiconductor film is heated at 500 to 550° C. for 2 to 20 hours. In this instance, the temperature is preferably set at multi-steps in the range of 500 to 550° C. so as to increase gradually. By an initial low temperature heating process, hydrogen or the like in the amorphous semiconductor film is released. Accordingly, so-called hydrogen releasing reaction can be performed, which leads to reduce roughness of a film surface due to crystallization. Moreover, a metal element that promotes crystallization, for example, nickel, is preferably formed over the amorphous semiconductor film since healing temperature can be reduced. Even in the crystallization using the metal element, the amorphous semiconductor film can be heated at 600 to 950° C.

There is fear that the metal element may adversely affect the electric characteristics of a semiconductor element; therefore, a gettering process is required to be performed for reducing or removing the metal element. For example, a process for trapping the metal element using the amorphous semiconductor film as a gettering sink is performed.

Alternatively, a crystalline semiconductor film may be formed directly over a subject surface. In this instance, the crystalline semiconductor film can be formed directly over the subject surface by using a fluoride source gas such as $GeF_4$ or $F_2$, and a silane source gas such as $SiH_4$ or $Si_2H_6$ and by utilizing heat or plasma. In the case that the crystalline semiconductor film is directly formed and high temperature processing is required, a quartz substrate having high heat resistance is preferably used.

The semiconductor film formed in this manner can be used for a first N-type TFT 215, a second N-type TFT 216, a P-type TFT 217, and a capacitor 218. The TFT may have any structures such as a single drain structure including only a high concentration impurity region, an LDD region including a low concentration impurity region, and a GOLD structure in which a low concentration impurity region is overlapped with a gate electrode. In this embodiment mode, each of the first N-type TFT and the P-type TFT has a single drain structure while the second N-type TFT has an LDD structure.

As shown in FIG. 16A, an impurity element is added to a semiconductor film to be the capacitor 218. In this embodiment mode, an N-type impurity element, for example, phosphorus (P) and the like can be added. At this time, a semiconductor film in a TFT region is covered with a mask 219 so as not to be added impurity elements. A resist mask can be used as the mask.

After that, as shown in FIG. 16B, an insulating film 303 which functions as a gate insulating film is formed. As the insulating film, a single layer structure or a stacked-layer structure of an insulating film containing oxygen or nitrogen, such as silicon oxide ($SiO_x$), silicon nitride ($SiN_x$), silicon oxynitride ($SiO_xN$) (x>y), and silicon nitride oxide ($SiN_xO_y$) (x>y) (x, y=1, 2 . . . ) can be used. In this embodiment mode, a silicon nitride film is used. The silicon nitride film has a higher dielectric constant than a silicon oxide film. Therefore, even when the thickness of the gate insulating film becomes rather thick, unnecessary gate capacitance can be reduced. In this manner, it is preferable to form the gate insulating using an insulating material with a higher dielectric constant as TFTs and the like become finer.

Then, a conductive film which functions as a gate electrode is formed. A gate electrode 304 may be a single layer or stacked layers formed of an element selected from Ta, W, Ti, Mo, Al, and Cu, an alloy material or a compound material having the aforementioned element as a main component. In this embodiment mode, a first conductive film 304a with a thickness of 10 to 50 nm, for example a tantalum nitride film with a thickness of 30 nm, is formed, and a second conductive film 304b with a thickness of 200 to 400 nm, for example a tungsten film with a thickness of 370 nm, is formed sequentially.

The first and second conductive films 304a and 304b are etched into predetermined shapes. In this embodiment mode, the first and second conductive films 304a and 304b are formed to have tapers at edge portions.

Further, the first and second conductive films 304a and 304b may be etched. In this embodiment mode, the first and second conductive films 304a and 304b are etched to have no tapers, that is, to have perpendicular edge portions as shown in FIG. 16C. At this time, by using an etchant with a different etching rate to the first and second conductive films 304a and 304b, the first conductive film 304a can be more etched.

In order to form a TFT having a fine gate length, a width of a conductive film may be shortened. Therefore, a mask provided for etching the conductive film, for example a step of thinning a resist mask may be provided. For example, the resist mask can be thinned by applying oxygen plasma.

Figure 17A:
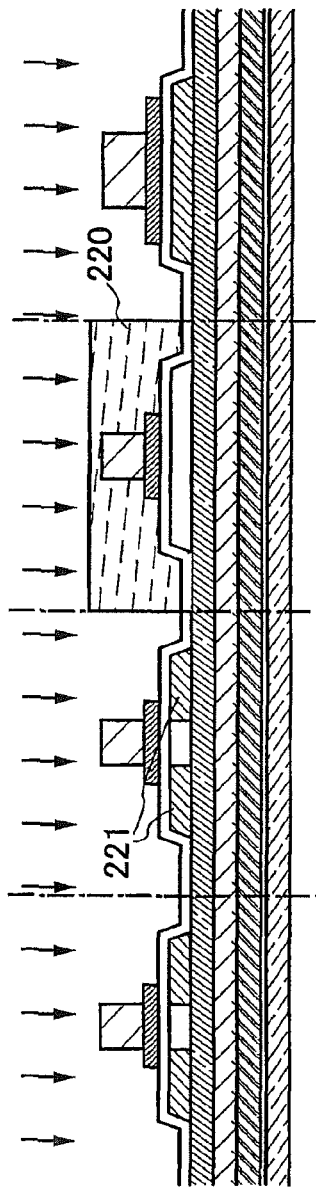
FIGS. 17A to 17C are diagrams showing manufacturing steps of a wireless processor or a wireless memory of the invention.

As shown in FIG. 17A, a mask to cover the P-type TFT 217, for example a resist mask 220 is formed. After that, an element imparting N-type conductivity, for example phosphorus (P) is added to the semiconductor film 214. Then, by controlling the amount of element to be added, a low concentration impurity region 221 is formed. Then, a resist mask 220 is removed.

Figure 17B:
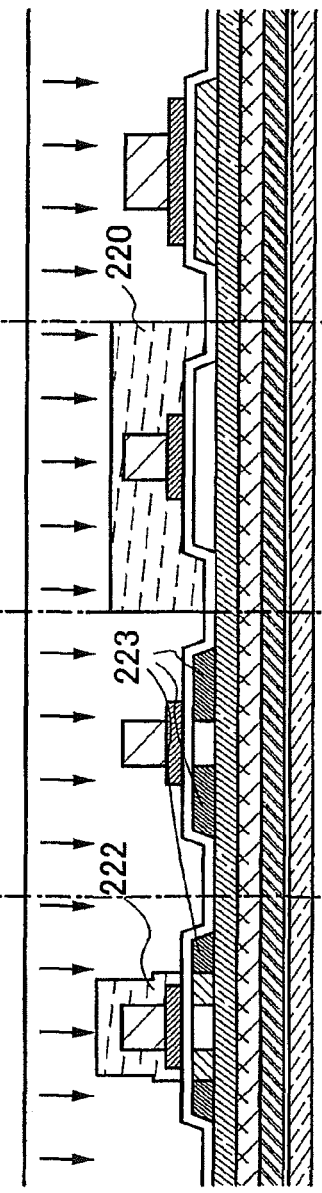

After that, a mask to cover a portion of each of the first and second N-type TFTs 215 and 216, for example a resist mask 222 is formed as shown in FIG. 17B, and then an element imparting N-type conductivity is added to the semiconductor film 214. By controlling the amount of element to be added, high concentration impurity regions 223 are formed. At this time, as impurity regions included in the second N-type TFT 216 can all be high concentration impurity regions as the second conductive film 304a is quite thin. Moreover, after forming a resist to cover only the second conductive film 304b at the same time as the resist mask 222, a high concentration impurity region may be formed by adding the element.

Further, a sidewall may be provided instead of the resist mask 222 to form a high concentration impurity region.

At this time, the resist mask 220 is formed again so that the element is not added to the P-type TFT. Alternatively, the resist mask 220 may be used without being removed in the preceding step.

Figure 17C:
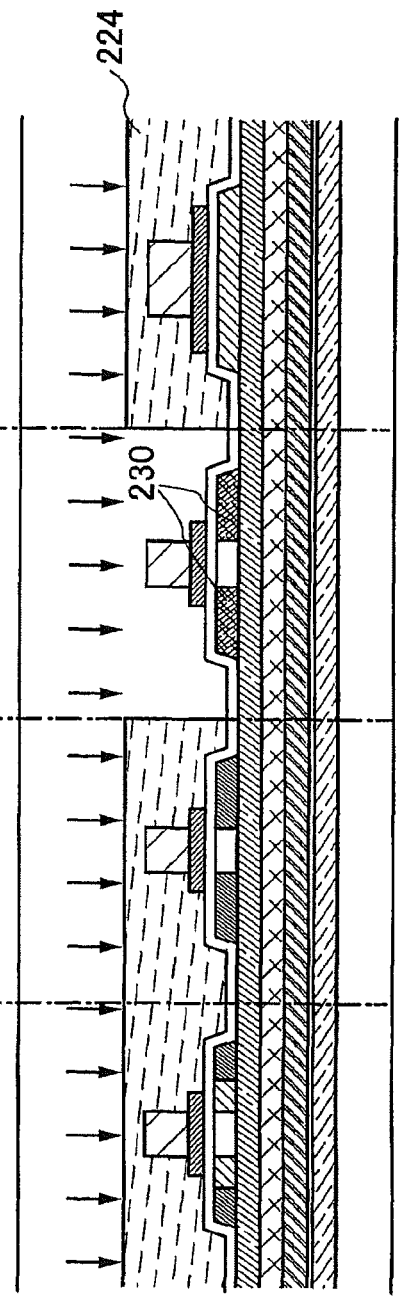

Subsequently, in order to form the P-type TFT 217, a mask to cover the N-type TFTs 215 and 216, and the capacitor 218, for example a resist mask 224 is formed as shown in FIG. 17C. Then, an element imparting P-type conductivity, for example, boron (B) is added to the semiconductor film 214. At this time, by controlling the amount of element to be added, an impurity region 230 can be formed. Here, the impurity region is not distinguished by high concentration or low concentration because high or low of the impurity region is determined relatively and the P-type TFT has only one impurity region.

After that, heat treatment is performed appropriately to alleviate a defect in a semiconductor film. For example, after forming the insulating films 225 and 226 sequentially as shown in FIG. 18A, heat treatment can be performed. As the insulating films 225 and 226, an insulating film containing oxygen or nitrogen, such as silicon oxide ($SiO_x$), silicon nitride ($SiN_x$), silicon oxynitride ($SiO_xN_y$) (x>y), and silicon nitride oxide ($SiN_xO_y$) (x>y) (x, y=1, 2 . . . ) can be used. In this embodiment mode, SiON is used for the insulating film 225 while SiNO is used for the insulating film 226. By hydrogen contained in these insulating films, dangling bonds in the semiconductor film can be reduced.

After that, an interlayer insulating film 227 is formed to improve planarity. Such an interlayer insulating film can be formed of an organic material or an inorganic material. As an organic material, polyimide, acryl, polyamide, polyimide amide, resist or benzocyclobutene, siloxane, and polysilazane can be used. Siloxane has a backbone structure of a bond of silicon (Si) and oxygen (O). As a substituent, an organic group containing at least hydrogen (for example, an alkyl group, and aromatic carbon hydride) and a fluoro group may be used. Alternatively, both of the organic group containing at least hydrogen and the fluoro group may be used as the substituent. Polysilazane is formed of a liquid material containing a polymer material containing a bond of silicon (Si) and nitrogen (N), what is so-called polysilazane as a starting material. As an inorganic material, an insulating film containing oxygen or nitrogen, such as silicon oxide ($SiO_x$), silicon nitride ($SiN_x$), silicon oxynitride ($SiO_xN_y$) (x>y), and silicon nitride oxide ($SiN_xO_y$) (x>y) (x, y=1, 2 . . . ) can be used. Further, as an interlayer insulating film, a stacked-layer structure of these insulating films may be used as well. In particular, when an interlayer insulating film is formed using an organic material, moisture and oxygen are absorbed by the organic material while planarity is increased. In order to prevent this, an insulating film containing an inorganic material may be formed over the organic material. When an insulating film containing nitrogen is used as an inorganic material, an alkaline ion such as Na can be prevented from entering.

Subsequently, an opening portion is formed in the interlayer insulating film 227, the insulating films 225 and 226, and a gate insulating film 303 so as to expose the high concentration impurity region 223 and the impurity region 230. Then, a conductive film 228 which functions as a wiring is formed at the opening portion.

After that, an insulating film which functions as a protective film may be formed. The insulating film which functions as the protective film preferably contains nitrogen.

In this manner, when a thin film transistor is formed, the opening portion (such as a groove and a hole) 32 is formed except in a region in which an element forming region having a TFT or a capacitor is formed while, so as to expose the reactant 213. In this embodiment mode, the opening portion 32 is formed between the P-type TFT 217 and the capacitor 218. Similarly to FIG. 15B, the support substrate 33 in which the hole 34 is formed is fixed to the insulating substrate 210 by using an adhesive and the like. The adhesive may be a resin material such as an ultraviolet ray curable resin and a heat curable resin, a double-faced tape, and the like.

After that, the etchant 35 is filled in the opening portion 32 through the hole 34. As a result, the peeling layer 30 can be removed. The peeling layer in this embodiment mode is the metal film 211 and the reactant 213 formed over the insulating substrate. By removing the metal film 211 and the reactant 213, the insulating substrate can be peeled off. In the case of using the metal film as the peeling layer, the support substrate 33 can be removed at least by a reactant reacting with the etchant.

As the etchant, a gas or a liquid containing halogenated fluoride can be used to chemically remove the peeling layer. As halogenated fluoride, for example, $ClF_3$ (chlorine trifluoride) can be used. The peeling layer is preferably formed of W and $WO_3$ which is an oxide thereof because it reacts quickly with $ClF_3$ and the peeling layer can be removed in a short time. It is preferable to use an etchant to remove the peeling layer chemically as generation of a reaction residue and the like can be reduced.

Other than the method for chemically removing the peeling layer as described above, the peeling layer can be removed physically by applying a stress. In the case where an oxide film containing W is formed as described above, tungsten oxide ($WO_x$ (x=2 to 3)) can easily be peeled off physically when a valency thereof changes.

The methods for removing the peeling layer chemically and physically may be used in combination. As a result, the peeling layer can be removed more easily and quickly.

In this manner, the peeling layer is removed, the insulating substrate 210 is peeled off, and thus the element forming region 45 can be fixed on a flexible substrate such as a plastic substrate and a plastic film substrate by using an adhesive. As the adhesive, a resin material such as an ultraviolet ray curable resin and a heat curable resin, a double-faced tape, and the like can be used.

In the case of forming a wireless memory in this manner, the insulating substrate 210 can be reused, which can reduce the unit price of a wireless memory. Further, the insulating substrate 210 is not required to transmit laser light; therefore, the design freedom can be increased.

Embodiment Mode 15

In this embodiment mode, a structure and a manufacturing method of a TFT used for a wireless processor or a wireless memory is described.

Figure 19A:
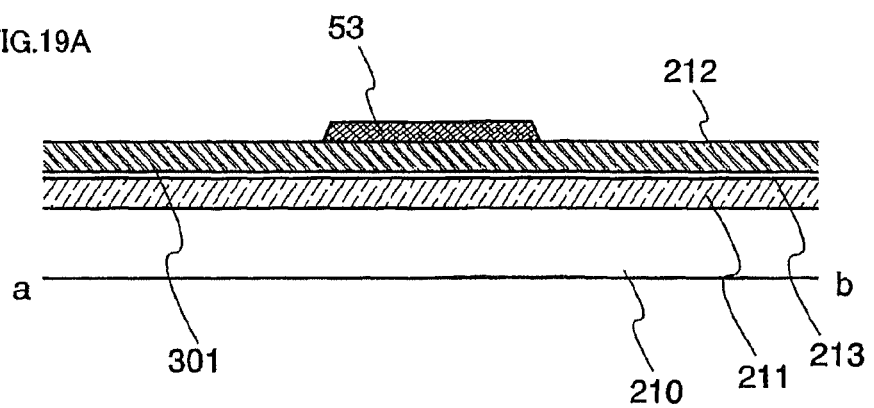
FIGS. 19A and 19B are diagrams showing manufacturing steps of a wireless processor or a wireless memory of the invention.

As shown in FIG. 19A, the metal film 211, the oxide film 213 containing the metal, and a silicon oxide film 212 are sequentially provided over the insulating substrate 210. In the case of using W for the metal film, the oxide film ($WO_x$ (x=2 to 3)) 213 containing W is formed. Then, a conductive film 53 which functions as a bottom electrode (also referred to as a bottom electrode 53) is formed. The conductive film 53 can be formed of a polycrystalline semiconductor to which a metal or an impurity of one conductivity type is added. In the case of using a metal, tungsten (W), molybdenum (Mo), titanium (Ti), tantalum (Ta), aluminum (Al) and the like can be used. The conductive film 53 can be etched into a predetermined shape by using a mask, for example a resist mask. At this time, the resist mask can be thinned by oxygen plasma, for example. By such steps, the conductive film 53 to be a gate electrode can be thinned.

Figure 19B:
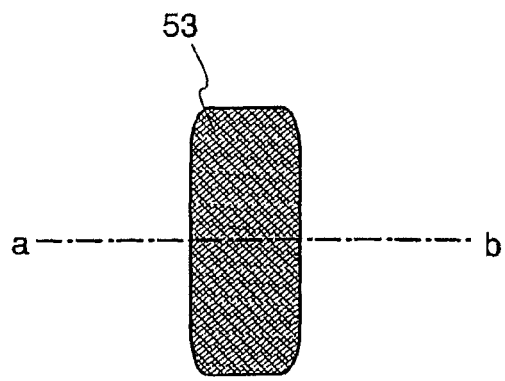

FIG. 19B is a top plan view of the conductive film 53 while FIG. 19A corresponds to a cross-sectional view taken along a-b in FIG. 19B.

Figure 20A:
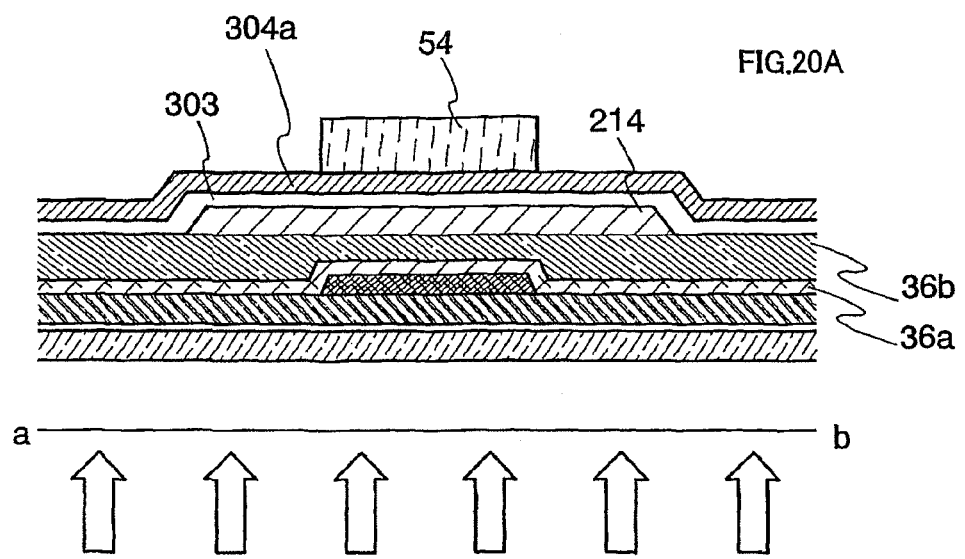
FIGS. 20A and 20B are diagrams showing manufacturing steps of a wireless processor or a wireless memory of the invention.

As shown in FIG. 20A, insulating films 36a and 36b which function as a base film are formed. In this embodiment mode, a silicon nitride film 36a and a silicon oxynitride film 36b are formed as a first insulating film and a second insulating film respectively, however, the order of stacking layers is not limited to this.

Subsequently, the semiconductor film 214 having a predetermined shape, the gate insulating film 303 provided so as to cover the semiconductor film 214, and the conductive film 304a which functions as a gate electrode are sequentially formed. In order to pattern the conductive film 304a into a predetermined shape, a mask, for example, a resist mask is formed. At this time, a resist mask 54 having a predetermined shape can be formed by back exposure using the conductive film 53 as a bottom electrode. By using the resist mask 54, the conductive film 304a is patterned into a predetermined shape.

Figure 20B:
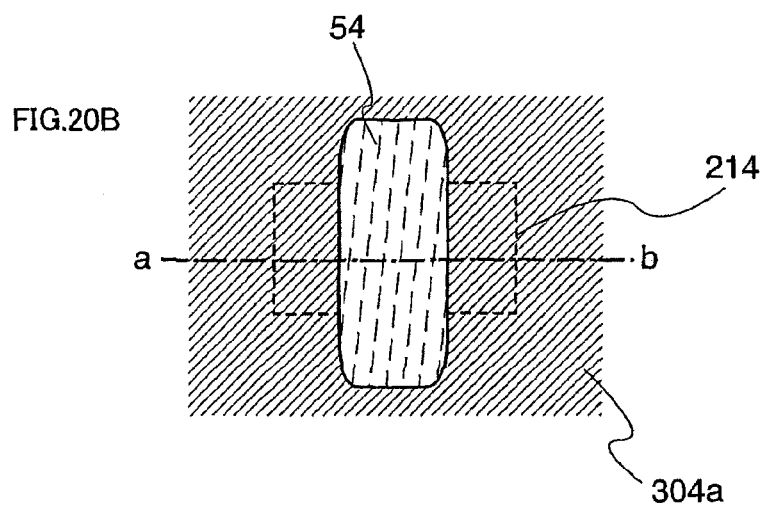

FIG. 20B is a top plan view of the conductive film 304a over which a resist mask is provided while FIG. 20A corresponds to a cross-sectional view taken along a-b in FIG. 20B.

Figure 21A:
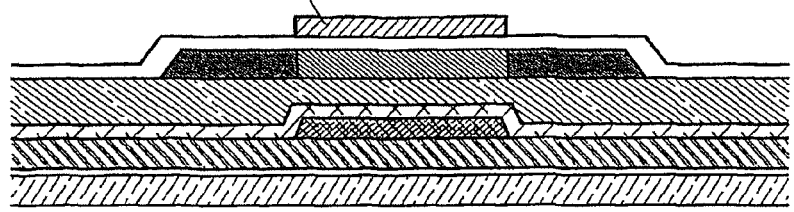
FIGS. 21A and 21B are diagrams showing manufacturing steps of a wireless processor or a wireless memory of the invention.

After that, as shown in FIG. 21A, an impurity element is added to the semiconductor film 214 by using the patterned conductive film 304a.

In order to control the bottom electrode 53 and the conductive film 304a independently, a wiring is provided for each of them. At this time, for providing a contact hole to connect the bottom electrode 53 and the wiring, a portion of the conductive film 304a is removed. At this time, a portion of the conductive film 304a may be etched by providing a mask, for example a resist mask over the conductive film 304a.

Figure 21B:
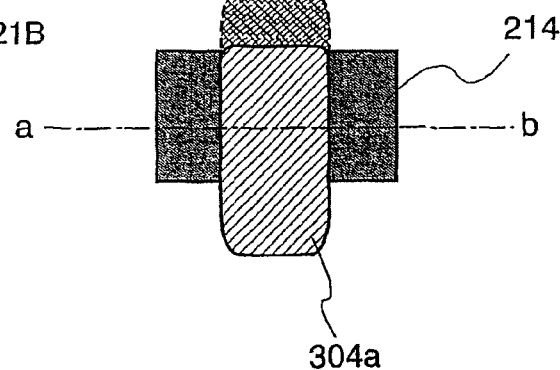

FIG. 21B is a top plan view of the conductive film 304a which is partially etched while FIG. 21A corresponds to a cross-sectional view taken along a-b in FIG. 21B.

In the case of controlling the bottom electrode 53 and the conductive film 304a similarly, a portion of the conductive film 304a is not required to be removed. By forming a contact hole in the gate insulating film 303 provided over the bottom electrode 53 and forming the conductive film 304a in the contact hole, the bottom electrode 53 and the conductive film 304a can be connected.

Next, as shown in FIG. 22A, the conductive film 304b may be formed so that the gate electrode has a stacked-layer structure. In this embodiment mode, the conductive film 304b can be patterned into a predetermined shape by using a mask, for example a resist mask. Then, an impurity element may be added with the conductive film 304b provided. At this time, a low concentration impurity region can be formed so as to overlap the conductive film 304a.

After that, an insulating film 305 is formed so as to cover the gate electrode. The insulating film 305 can be formed of an insulating film containing oxygen or nitrogen, such as silicon oxide ($SiO_x$), silicon nitride ($SiNO_x$), silicon oxynitride ($SiO_xN_y$) (x>y), and silicon nitride oxide ($SiN_xO_y$) (x>y) (x, y=1, 2 ... ). In this embodiment mode, silicon oxynitride is used. In particular, more hydrogen can be contained by forming the insulating film 305 by a plasma CVD method. By this hydrogen, dangling bonds in the semiconductor film 214 can be reduced. Accordingly, it is preferable to apply heat treatment with the insulating film 305 provided.

After that, an interlayer insulating film 306 is formed so as to cover the insulating film 305 to improve planarity. Such an interlayer insulating film can be formed of an organic material or an inorganic material. As an organic material, polyimide, acryl, polyamide, polyimide amide, resist or benzocyclobutene, siloxane, and polysilazane can be used. Siloxane has a backbone structure of silicon (Si) and oxygen (O), and is formed of a polymer material as a starting material containing at least hydrogen or at least one of fluoride, an alkyl group, and an aromatic carbon hydride as a substituent. Polysilazane is formed of a liquid material containing a polymer material containing a bond of silicon (Si) and nitrogen (N), so-called polysilazane as a starting material. As an inorganic material, an insulating film containing oxygen or nitrogen, such as silicon oxide ($SiO_x$), silicon nitride ($SiN_x$), silicon oxynitride ($SiO_xN_y$) (x>y), and silicon nitride oxide ($SiN_xO_y$) (x>y) (x, y=1, 2 ... ) can be used. Further, as an interlayer insulating film, a stacked-layer structure of these insulating films may be used as well. In particular, when an interlayer insulating film is formed of an organic material, moisture and oxygen are absorbed by the organic material while planarity is increased. In order to prevent this, an insulating film containing an inorganic material may be formed over the organic material. When an insulating film containing nitrogen is used as an inorganic material, an alkaline ion such as Na can be prevented from entering.

The heat treatment after forming the insulating film 305 may be performed after forming the interlayer insulating film 306 as well.

After that, a contact hole is formed in the interlayer insulating film 306, the insulating film 305, and the gate insulating film 303, thereby a wiring 307 connected to an impurity region is formed.

Furthermore, an insulating film which functions as a protective film may be formed over the wiring. Such an insulating film can be formed of an insulating film containing oxygen or nitrogen, such as silicon oxide ($SiO_x$), silicon nitride ($SiN_x$), silicon oxynitride ($SiO_xN_y$) (x>y), and silicon nitride oxide ($SiN_xO_y$) (x>y) (x, y=1, 2 ... ). In particular, an insulating film containing nitrogen is preferably used for preventing an impurity element from entering.

FIG. 22B is a top plan view in which a wiring 307, a wiring connected to a bottom electrode, and a wiring connected to a gate electrode are provided while FIG. 22A corresponds to a cross-sectional view taken along a-b in FIG. 22B. It is to be noted that the conductive film 304b is not shown.

In this manner, a TFT including a bottom electrode can be formed. The TFT including the bottom electrode can be controlled independently of the gate electrode. Accordingly, in the case of forming a fine TFT, a current may flow even when inputting a signal to the gate electrode to be turned off. At this time, the TFT can be accurately turned off by controlling the bottom electrode. As a result, low power consumption can be realized.

With the bottom electrode, a threshold voltage (Vth) can also be controlled.

Embodiment Mode 16

In this embodiment mode, a structure of a TFT which is different than the aforementioned embodiment modes is described.

Figure 23:
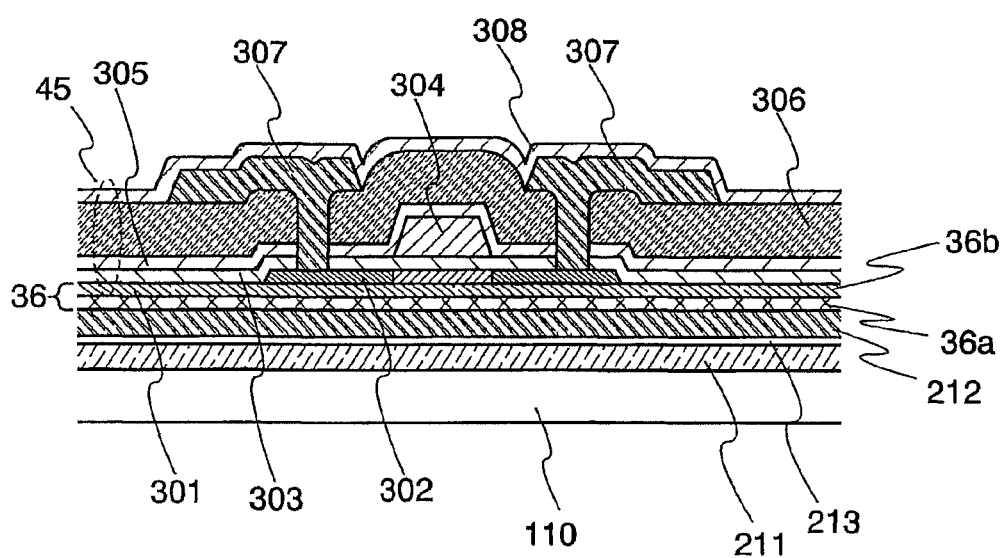
FIG. 23 is a diagram showing a wireless processor or a wireless memory of the invention.

FIG. 23 shows an example of applying a top-gate type TFT. The peeling layer 30, the first insulating films 36 and 301 which are stacked are formed over the first substrate 210, over which an element forming region (a layer including this is referred to as an element forming layer) 45 is formed. The first insulating film 301 at least functions as a base film for a semiconductor film 302. The second insulating film 303 which functions as a gate insulating film is provided so as to cover the semiconductor film 302. The conductive film 304 which functions as a gate electrode for the semiconductor film 302 is formed over the second insulating film 303, over which the third insulating film 305 which functions as a protective layer and the fourth insulating film 306 which functions as an interlayer insulating film are provided as protective layers. Above the insulating film 306, the fifth insulating film 308 may be formed as a protective layer.

The semiconductor film 302 is formed of a semiconductor having a crystalline structure (a crystalline semiconductor), to which an amorphous semiconductor or a single crystalline semiconductor can be applied. In particular, it is preferable to apply a crystalline semiconductor which is obtained by crystallizing an amorphous or micro-crystalline semiconductor by laser light irradiation, a crystalline semiconductor obtained by crystallization by heat treatment, and a crystalline semiconductor obtained by crystallization by a combination of heat treatment and laser light irradiation. In the heat treatment, a metal element which promotes a crystallization of a silicon semiconductor, such as nickel can be used for crystallization.

In the case of the crystallization by laser light irradiation, crystallization can be carried out by irradiating continuous wave laser light. Alternatively, by the irradiation of high repetition frequency ultrashort light pulse of which repetition frequency is 10 MHz or higher, pulse width is 1 nano second or shorter, or preferably 1 to 100 pico seconds, crystallization can be performed by continuously moving a melt band which is a melted semiconductor in the direction of laser light irradiation. According to such a crystallizing method to irradiate with laser light, a crystalline semiconductor having large crystal grains extending in one direction can be obtained. By adjusting a drifting direction of carriers to the extending direction of the crystal grains, field effect mobility of a transistor can be enhanced. For example, the field effect mobility of 400 cm$^2$/V·sec or higher can be realized.

As described above, the heat treatment at 400° C. or higher is required to peel the peeling layer 30 formed of tungsten (W)

at an interface with the peeled layer 12 accurately. This heat treatment can be performed as the heat crystallization step of the semiconductor film.

The gate electrode 304 can be formed of a metal or a polycrystalline semiconductor which is added an, impurity of one conductivity type. In the case of using a metal, tungsten (W), molybdenum (Mo), titanium (Ti), tantalum (Ta), aluminum (Al) and the like can be used. Further, a metal nitride obtained by nitriding the aforementioned metal can be used. Alternatively, a stacked-layer structure of a first layer formed of the metal nitride and a second layer formed of the metal may be employed as well. In the case of the stacked-layer structure, so-called a hat shape may be employed in which edge portions of the first layer project outside than edge portions of the second layer. In this case, barrier property can be enhanced when the first layer is formed of a metal nitride. Accordingly, it can be prevented that the metal of the second layer diffuses to the second insulating film 303 and the semiconductor film 302 underneath.

A transistor formed by using the semiconductor film 302, the second insulating film 303, the gate electrode 304 and the like in combination can employ various structures such as a single drain structure, an LDD (Lightly Doped Drain) structure, and a gate overlap drain structure. Further, a single gate structure, a multi-gate structure in which transistors to which gate voltages of the same potentials are equivalently applied are connected in series, and a dual gate structure in which a semiconductor film is sandwiched by gate electrodes from above and below can be applied.

The fourth insulating film 306 can be formed of an inorganic insulating material such as silicon oxide and silicon oxynitride and an organic insulating material such as an acryl resin and a polyimide resin. In the case of using an application method such as a spin coating method and a roll coating method, silicon oxide formed by heat treatment can be used after applying an insulating film material dissolved in an organic solvent. For example, an insulating layer which can be formed by heat treatment at 200 to 400° C. can be used after forming a coated film containing a siloxane bond. By using an insulating film formed by an application method as the fourth insulating film 306, the surface thereof can be planarized by reflow. Moreover, the insulating film can be planarized by a reflow. By forming a wiring over such a planarized insulating film, a breaking of the wiring can be prevented, which is efficient in the case of forming multi-layer wirings.

The wiring 307 is formed on the fourth insulating film 306. The wiring 307 is preferably formed of a combination of a low resistant material such as aluminum (Al) and a high-melting point metal material such as titanium (Ti) and molybdenum (Mo), for example a stacked-layer structure of titanium (Ti) and aluminum (Al) and a stacked-layer structure of molybdenum (Mo) and aluminum (Al).

After that, the components are transferred to a flexible substrate, and then can be attached to a semiconductor device with an attaching agent.

Figure 24:
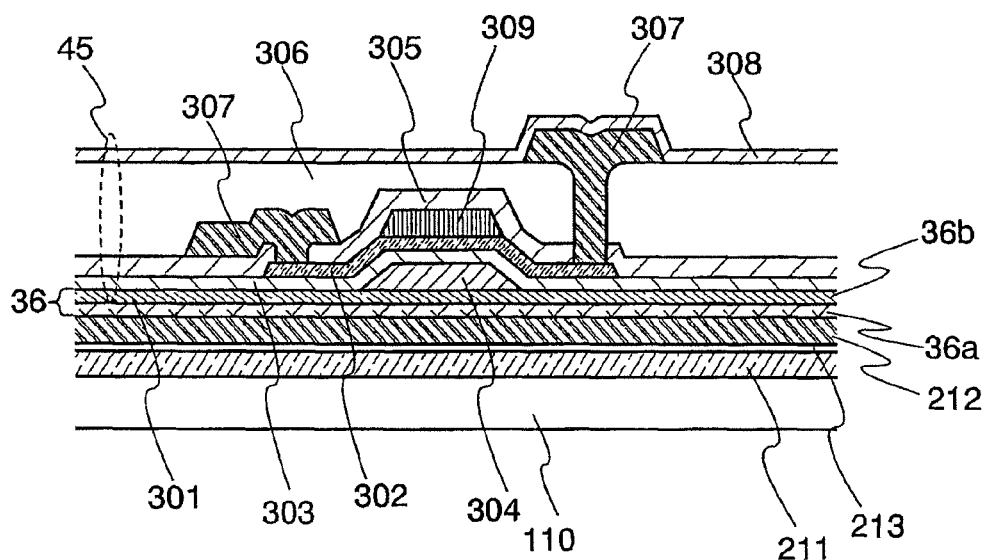
FIG. 24 is a diagram showing a wireless processor or a wireless memory of the invention.

FIG. 24 shows an example of applying a bottom gate type TFT. The peeling layer 30 and the insulating film 36 are sequentially formed over the first substrate 210, over which the element forming layer 45 is formed. In the element forming layer 45, the gate electrode 304, the second insulating film 303 which functions as the gate insulating film, the semiconductor film 302, a channel protective layer 309, the third insulating film 305 which functions as a protective layer, and the fourth insulating film 306 which functions as an interlayer insulating film are provided. Above the element forming layer 45, the fifth insulating film 308 which functions as a protective film may be provided. The fifth insulating film 308 can be formed to have a single layer structure or a stacked-layer structure of an insulating film containing oxygen or nitrogen such as silicon oxide ($SiO_x$), silicon nitride ($SiN_x$), silicon oxynitride ($SiO_xN_y$) (x>y), and silicon nitride oxide ($SiN_xO_y$) (x>y) (x, y=1, 2 . . . ). The wiring 307 can be formed over the third insulating film 305 or the fourth insulating film 306.

After that, the components are transferred to a flexible substrate, and then can be attached to a semiconductor device by an adhesive.

In this manner, a thin film transistor used for a high functional integrated circuit may be a top or bottom gate type transistor. Moreover, a top gate type transistor and a bottom gate type transistor may be used in combination. That is, the invention is not limited in the structure of a thin film transistor.

Embodiment Mode 17

Figure 25:
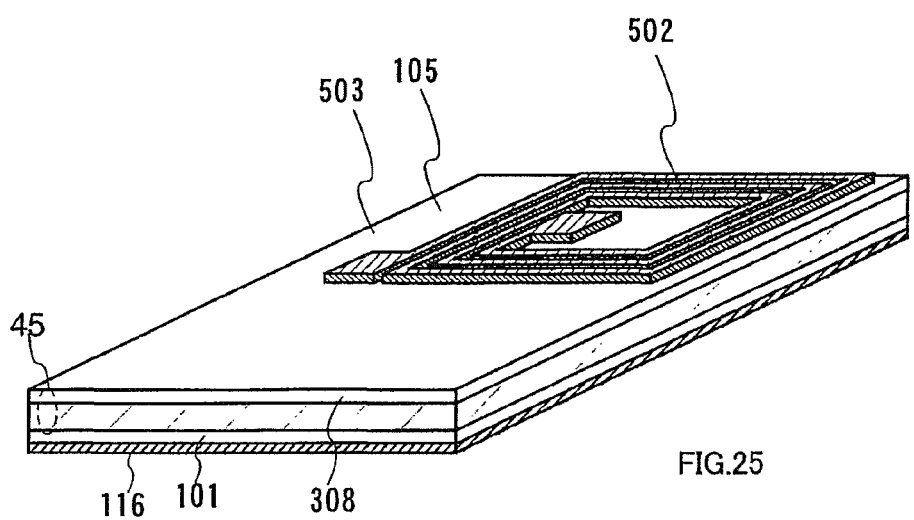
FIG. 25 is a view showing a wireless processor or a wireless memory and an antenna of the invention.

In this embodiment mode, the case of integrating an antenna in a high functional integrated circuit is described with reference to FIG. 25.

As described in Embodiment Mode 16, the element forming layer 45 covered with the fifth insulating film 308 is formed. The fifth insulating film 308 can be formed of a material described in Embodiment Mode 16. In the case of using a conductive material such as Cu of which diffusion is concerned for an antenna material, it is preferable to use at least an insulating film containing nitrogen for the fifth insulating film 308. As a wireless memory incorporating a high functional integrated circuit may be touched by a bare hand, an alkaline metal such as Na may diffuse. Accordingly, it is preferable to form the fifth insulating film 308 so as to include at least an insulating film containing nitrogen.

After that, an antenna 502 is formed. The antenna 502 can be formed by any one of or a combination of a printing method, a sputtering method, a droplet discharging method, a plating method, a photolithography method, or a deposition method using a metal mask. For example, there is a stacked-layer antenna in which a first antenna formed by any one of a sputtering method, a droplet discharging method, a printing method, a photolithography method, and a deposition method, and a second antenna formed so as to cover the first antenna by a plating method (an electroless plating method or an electrolytic plating method) are stacked. It is preferable to form the antenna by a droplet discharging method or the printing method as a conductive film is not required to be patterned, thus the manufacturing steps can be reduced.

For the antenna material, a conductive material such as Ag (silver), Al (aluminum), Au (gold), Cu (copper), and Pt (platinum) can be used. When wiring resistance of the aforementioned materials is concerned, the wiring resistance can be reduced by forming the antenna thick. When an antenna forming region is wide, the wiring resistance can be reduced by forming the width of the antenna wider. Further, as described above, the wiring resistance may be reduced by using a stacked-layer antenna so as to be covered with a low resistant material. On the other hand, when using a conductive material such as Cu of which diffusion is considered, it is preferable to form an insulating film containing nitrogen so as to cover the surface over which the antenna is formed and/or around Cu.

When employing the droplet discharging method, the antenna can be formed by dropping Ag mixed in tetradecane as a solvent from a nozzle. At this time, a base film formed of titanium oxide ($TiO_x$) may be formed over the substrate for the antenna.

It is preferable to form a connecting terminal 503 for the antenna. By using the connecting terminal, the antenna can be simply and easily connected to a wiring of the high functional integrated circuit. The connecting terminal is not necessarily provided, and the shape and position of the antenna are not limited to those shown in FIG. 25.

The planarity of the antenna formed as described above may be improved by applying a pressure thereto. As a result, the antenna can be formed into a thin film. Heat may be applied in addition to a pressure, and press treatment and heat treatment can be performed at the same time. In the case where the solvent is required to be removed by heat treatment when employing a droplet discharging method, the press treatment and the heat treatment are preferably performed at the same time.

An opening portion is formed in the fifth insulating film 308 to connect the wiring and the antenna 502. At this time, it is preferable to form the opening portion under the connecting terminal 503.

Heretofore described is the case of forming the antenna 502 over the fifth insulating film 308 over the wirings; however, the antenna may be formed in the same layer as the wirings.

In this embodiment mode, the antenna is directly formed over the high functional integrated circuit; however, the antenna may be formed over a different substrate than that of the high functional integrated circuit and attached thereto.

A wireless memory can be formed by incorporating the antenna formed in this manner.

The high functional integrated circuit can be peeled off by any of the methods described in the aforementioned embodiment modes.

Subsequently, an attaching agent 116 is formed on the back of a flexible substrate 101. As the attaching agent 116, a magnet or a sealing material can be used. With the attaching agent, a wireless memory can be fixed to a main body of a semiconductor device and the like.

Embodiment Mode 18

In this embodiment mode, a TFT structure applied to a circuit in a wireless processor or a wireless memory and the like is described.

A wireless processor of the invention typically has a structure as described in Embodiment Mode (refer to FIG. 1). The circuit blocks forming the wireless processor are sometimes required to have different operation characteristics; therefore, it is preferable to optimize the element structure accordingly. In this embodiment mode, a structure of a wireless processor is described representatively, although this applies to a wireless memory as well.

For example, as electromagnetic wave is inputted as an input signal to a wireless processor, a higher voltage is applied to an element near an input terminal as the electromagnetic field is stronger. In the case of providing a limiter circuit so that such a high voltage is not generated, a large current flows to the limiter circuit. It is preferable to employ a highly reliable element structure for such an element, for example an LDD structure is preferred to a single drain structure. Alternatively, it is preferable to employ a structure to form a gate insulating film thick. In a wireless processor, it is preferable that such a TFT structure which has an LDD structure and a gate insulating film formed thick be applied to an input portion of a circuit connected to the RF circuit 5001. For example, an input portion of a circuit connected to the power source circuit 5002, an input portion of a circuit connected to the clock generating circuit 5003, and an input portion of a circuit connected to the data demodulation circuit 5004 are applicable. Moreover, a TFT structure which has an LDD structure and a gate insulating film formed thick are preferably applied to a limiter circuit.

On the other hand, the clock generating circuit 5003 and the power source circuit 5002 are required to operate at high rate as input signals of the highest frequency are inputted thereto. Therefore, an element which forms such a circuit preferably employs a TFT structure which can operate at high rate. For example, such a structure having a shortened channel length, a single drain structure, or a thinned gate insulating film is preferably employed.

Further, an input signal is often separated into an antenna portion and an internal circuit through a capacitor. In that case, the level relation of potentials at two terminals of the capacitor is reversed, thus a MOS capacitor cannot be used. It is preferable to use a capacitor of which semiconductor active layer is doped in advance by utilizing a gate insulating film which is superior in film quality. An example of a capacitor having such a TFT structure in a wireless processor is, a capacitor used in an input portion of the power source circuit 5002, the clock generating circuit 5003, or the data demodulation circuit 5004.

On the other hand, a digital signal is inputted to the CPU interface 5006, the memory 5008, and the CPU 5007, of which operating frequency is lower than the input signals. Therefore, a reliable structure such as an LDD structure is preferably used.

Embodiment Mode 19

Examples of a semiconductor device incorporating a wireless processor or a wireless memory of the invention are a video camera, a digital camera, a goggle type display (a head mounted display), a navigation system, an audio reproducing device (a car audio set, an audio component set and the like), a notebook personal computer, a game machine, a portable information terminal (a mobile computer, a portable phone, a portable game machine, an electronic book, and the like), an image reproducing device provided with a recording medium (specifically, a device which reproduces a recording medium such as a DVD: Digital Versatile Disc and has a display which can display the reproduced image) and the like. Specific examples of these semiconductor devices are shown in FIGS. 26A to 26D and 27A to 27E.

Figure 26A:
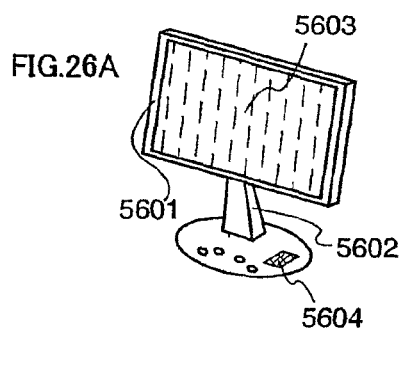
FIGS. 26A to 26D are views of semiconductor devices to each of which a wireless memory of the invention is mounted.

FIG. 26A illustrates a television receiver including a housing 5601, a support base 5602, a display portion 5603 and the like. The television receiver incorporates a driver of a wireless memory of the invention. By mounting a wireless memory 5604 of the invention to a main body by attaching and the like, data stored in the wireless memory 5604 can be read and used in the television receiver.

Figure 26B:
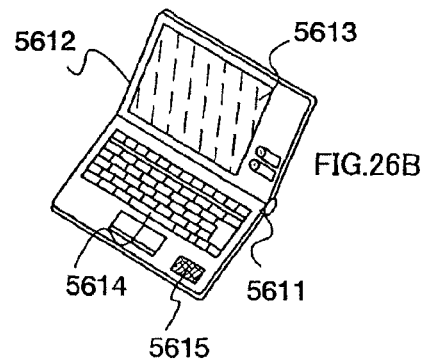

FIG. 26B illustrates a notebook personal computer including a main body 5611, a housing 5612, a display portion 5613, a keyboard 5614 and the like. The notebook personal computer incorporates a driver of a wireless memory of the invention. By mounting a wireless memory 5615 of the invention to a main body by attaching and the like, data stored in the wireless memory 5615 can be read and used in the notebook personal computer.

Figure 26C:
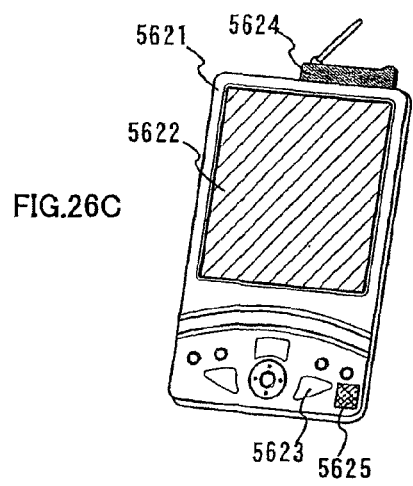

FIG. 26C illustrates a portable information terminal including a main body 5621, a display portion 5622, an operating key 5623, a modem 5624 and the like. The portable information terminal incorporates a driver of a wireless memory of the invention. By mounting a wireless memory 5625 of the invention to a main body by attaching and the like, data stored in the wireless memory 5625 can be read and used in the portable information terminal.

Figure 26D:
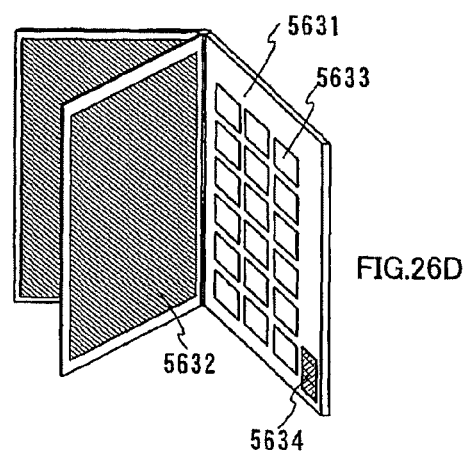

FIG. 26D illustrates an electronic book including a main body 5631, a display portion 5632, an operating key 5633 and the like. The electronic book incorporates a driver of a wireless memory 5634 of the invention. By mounting the wireless memory 5634 of the invention to a main body by attaching and the like, data stored in the wireless memory 5634 can be read and used in the electronic book.

FIG. 27A illustrates a portable information terminal including a main body 2001, a display portion 2002, an operating key 2003, a modem 2004 and the like, and a wireless processor 2005 of the invention is attached. FIG. 27A shows a portable information terminal of which modem 2004 can be demountable; however, the modem 2004 may be incorporated in the main body 2001 as well. The wireless processor 2005 can be easily incorporated by using a wireless processor interface of the invention, which can improve the function and performance.

FIG. 27B illustrates a portable phone including a main body 2101, a display portion 2102, an audio input portion 2103, an audio output portion 2104, an operating key 2105, an external connecting port 2106, an antenna 2107 and the like, and a wireless processor 2108 of the invention is attached. Note that power consumption of the portable phone can be suppressed by displaying white text on a black background in the display portion 2102. The wireless processor can be easily incorporated by using a wireless processor interface of the invention, which can improve the function and performance.

FIG. 27C illustrates an electronic card including a main body 2201, a display portion 2202, a connecting terminal 2203 and the like, and a wireless processor 2204 of the invention is placed in a short distance of the electronic card. The wireless processor can be easily incorporated by using a wireless processor interface of the invention, which can improve the function and performance. It is needless to say that a wireless processor may be attached to the electronic card. FIG. 27C shows a contact type electronic card, although a wireless processor of the invention can be applied to a non-contact type electronic card and an electronic card having both contact and non-contact functions.

FIG. 27D illustrates an electronic book including a main body 2301, a display portion 2302, an operating key 2303 and the like, and a wireless processor 2304 of the invention is attached. The electronic book may incorporate a modem in the main body 2301. The wireless processor can be easily incorporated by using a wireless processor interface of the invention, which can improve the function and performance.

FIG. 27E illustrates a sheet type personal computer including a main body 2401, a display portion 2402, a keyboard 2403, a touch pad 2404, an external connecting port 2405, a power plug 2406, and the like, and a wireless processor 2407 of the invention is attached. The wireless processor can be easily incorporated by suing a wireless processor interface of the invention, which can improve the function and performance.

As described above, an application range of the invention is quite wide and the invention can be applied to electronic devices of all fields. Note that the electronic devices of this embodiment mode can be implemented in combination with any configurations described in Embodiment Modes 1 to 18.

EXPLANATION OF REFERENCE

11: metal film, 12: peeled layer, 13: oxide, 14: support substrate, 15: first adhesive, 16: second adhesive, 30: peeling layer, 32: opening portion, 33: support substrate, 34: hole, 35: etchant, 36: insulating substrate, 36a: silicon nitride film, 36b: silicon nitride oxide film, 45: element forming region, 53: conductive film, 54: resist mask, 100: arithmetic processing unit, 101: flexible substrate, 102: memory unit, 103: power source circuit, 104: interface, 105: antenna, 110: flexible substrate, 116: attaching agent, 210: first substrate, 211: metal film, 212: silicon oxide film, 213: reactant, 214: island semiconductor film, 215: N-type TFT, 216: N-type TFT, 217: P-type TFT, 218: capacitor, 219: mask, 220: resist mask, 221: low concentration impurity region, 222: resist mask, 223: high concentration impurity region, 224: resist mask, 225: insulating film, 226: insulating film, 227: interlayer insulating film, 228: conductive film, 230: impurity region, 301: first insulating film, 302: semiconductor film, 303: insulating film, 304: gate insulating film, 304a: first conductive film, 304b: second conductive film, 305: insulating film, 306: insulating film, 307: wiring, 308: fifth insulating film, 309: channel protective film, 502: antenna, 503: connecting terminal, 2001: main body, 2002: display portion, 2003: operating key, 2004: modem, 2005: wireless processor, 2102: main body, 2102: display portion, 2103: audio input portion, 2104: audio output portion, 2105: operating key, 2106: external connecting port, 2107: antenna, 2108: wireless processor, 2201: main body, 2202: display portion, 2203: connecting terminal, 2204: wireless processor, 2301: main body, 2302: display portion, 2303: operating key, 2304: wireless processor, 2401: main body, 2402: display portion, 2403: keyboard, 2404: touchpad, 2405: external connecting port, 2406: power plug, 2407: wireless processor, 3000: wireless memory, 3003: RF circuit, 3004: power source circuit, 3005: clock generating circuit, 3006: data demodulation circuit, 3007: load modulation circuit, 3008: memory interface, 3009: nonvolatile memory, 3010: volatile memory, 3101: semiconductor device, 3102: wireless memory driver, 3103: wireless memory, 3104: wireless memory, 3105: wireless memory, 3200: semiconductor device, 3201: CPU, 3202: PCI interface, 3203: DRAM interface, 3204: DRAM, 3205: south bridge, 3206: graphics, 3207: wireless memory driver, 3208: display, 3209: ROM, 3210: keyboard, 3211: wireless memory, 3301: wireless memory driver, 3302: PCI interface, 3303: control circuit, 3304: electric wave interface, 3401: main body, 3402: display, 3403: keyboard, 3404: wireless memory, 5000: wireless processor, 5001: RF circuit, 5002: power source circuit, 5003: clock generating circuit, 5004: data demodulation circuit, 5005: load modulation circuit, 5006: CPU interface, 5007: CPU, 5008: memory, 5100: semiconductor device, 5101: CPU, 5102: memory unit, 5103: graphics, 5104: display, 5105: interface, 5106: hard disc, 5107: keyboard, 5108: wireless processor interface, 5109: wireless processor, 5200: wireless processor interface, 5201: PCI interface, 5202: control circuit, 5203: electric wave interface, 5301: semiconductor device, 5302: wireless processor interface, 5303: wireless processor, 5304: wireless processor, 5305: wireless processor, 5401: main body, 5402: display, 5403: keyboard, 5404: wireless processor, 5501: CPU, 5506: hard disc, 5508: wireless processor interface, 5509: wireless processor, 5510: CPU, 5511: memory, 5601: housing, 5602: support base, 5603: display portion, 5604: wireless memory, 5611: main body, 5612: housing, 5613: display portion, 5614: keyboard, 5615: wireless memory, 5621: main body, 5622: display portion, 5623: operating key, 5624: modem, 5625: wireless memory, 5631: main body, 5632: display portion, 5633: operating key, 5634: wireless memory, 5701: oscillation circuit, 5702: modulation circuit, 5703: amplifier circuit, 5704: antenna, 5705: demodulation circuit, 5706: amplifier circuit, 5707: band path filter, 5708: data transfer path, 5709: data reception path

The invention claimed is:

1. A wireless processor comprising:
    an element forming region comprising a transistor, the transistor comprising a semiconductor film with a thickness of 10 to 200 nm; and
    an antenna,
    wherein the transistor is fixed on a flexible substrate; and
    wherein the transistor comprises:
        a bottom electrode;
        a first insulating film over the bottom electrode;
        the semiconductor film over the first insulating film, the semiconductor film comprising a channel formation region;
        a second insulating film over the semiconductor film; and
        a gate electrode over the second insulating film.

2. The wireless processor according to claim 1, wherein the semiconductor film comprises an amorphous semiconductor or a crystalline semiconductor.

3. The wireless processor according to claim 1,
    wherein the semiconductor film comprises an impurity region, and
    wherein the impurity region and the gate electrode do not overlap each other.

4. The wireless processor according to claim 1, further comprising a third insulating film being in contact with the second insulating film and the gate electrode.

5. The wireless processor according to claim 1, further comprising:
    a first wiring being electrically connected to the bottom electrode; and
    a second wiring being electrically connected to the gate electrode.

6. The wireless processor according to claim 1, wherein the bottom electrode and the gate electrode are separately controlled.

7. The wireless processor according to claim 1, wherein the bottom electrode is electrically connected to the gate electrode.

8. The wireless processor according to claim 1, wherein a threshold voltage of the transistor is controlled by the bottom electrode.

9. A wireless memory comprising:
    an element forming region comprising a transistor, the transistor comprising a semiconductor film with a thickness of 10 to 200 nm; and
    an antenna,
    wherein the transistor is fixed on a flexible substrate; and
    wherein the transistor comprises:
        a bottom electrode;
        a first insulating film over the bottom electrode;
        the semiconductor film over the first insulating film, the semiconductor film comprising a channel formation region;
        a second insulating film over the semiconductor film; and
        a gate electrode over the second insulating film.

10. The wireless memory according to claim 9, wherein the semiconductor film comprises an amorphous semiconductor or a crystalline semiconductor.

11. The wireless memory according to claim 9,
    wherein the semiconductor film comprises an impurity region, and
    wherein the impurity region and the gate electrode do not overlap each other.

12. The wireless memory according to claim 9, further comprising a third insulating film being in contact with the second insulating film and the gate electrode.

13. The wireless memory according to claim 9, further comprising:
    a first wiring being electrically connected to the bottom electrode; and
    a second wiring being electrically connected to the gate electrode.

14. The wireless memory according to claim 9, wherein the bottom electrode and the gate electrode are separately controlled.

15. The wireless memory according to claim 9, wherein the bottom electrode is electrically connected to the gate electrode.

16. The wireless memory according to claim 9, wherein a threshold voltage of the transistor is controlled by the bottom electrode.

* * * * *